(12) United States Patent
Hamann et al.

(10) Patent No.: US 9,883,009 B2
(45) Date of Patent: Jan. 30, 2018

(54) AUTOMATIC COMPUTER ROOM AIR CONDITIONING CONTROL METHOD

(71) Applicant: International Business Machines Corporation, Armonk, NY (US)

(72) Inventors: Hendrik F. Hamann, Yorktown Heights, NY (US); Dennis G. Manzer, Bedford Hills, NY (US); Sergio A. Bermudez Rodriguez, Croton on Hudson, NY (US); Hans-Dieter Wehle, Horb Talheim (DE)

(73) Assignee: International Business Machines Corporation, Armonk, NY (US)

( * ) Notice: Subject to any disclaimer, the term of this patent is extended or adjusted under 35 U.S.C. 154(b) by 734 days.

(21) Appl. No.: 14/141,751

(22) Filed: Dec. 27, 2013

(65) Prior Publication Data

US 2015/0184883 A1    Jul. 2, 2015

(51) Int. Cl.
 *H05K 7/20* (2006.01)
 *H04L 29/06* (2006.01)

(52) U.S. Cl.
 CPC ......... *H04L 67/42* (2013.01); *H05K 7/20836* (2013.01)

(58) Field of Classification Search
 CPC ..... G05B 15/02; H04L 67/42; H05K 7/20836
 See application file for complete search history.

(56) References Cited

U.S. PATENT DOCUMENTS

| 7,114,555 B2 | 10/2006 | Patel et al. |
| 7,366,632 B2 | 4/2008 | Hamann et al. |
| 8,019,478 B2 * | 9/2011 | Whitehurst .......... F24F 11/0009 62/127 |
| 8,515,585 B2 | 8/2013 | Uraki et al. |
| 9,146,814 B1 * | 9/2015 | van der Merwe .. G06F 11/3031 |

(Continued)

FOREIGN PATENT DOCUMENTS

| CN | 201421153 Y | 3/2010 |
| CN | 201463149 U | 5/2010 |

(Continued)

OTHER PUBLICATIONS

H.F. Hamann et al., "Methods and techniques for measuring and improving data center best practices," 11th Intersociety Conference on Thermal and Thermomechanical Phenomena in Electronic Systems, ITHERM, May 28-31, 2008, pp. 1146-1152.

(Continued)

*Primary Examiner* — Kenneth M Lo
*Assistant Examiner* — Michael J Huntley
(74) *Attorney, Agent, or Firm* — Vazken Alexanian; Michael J. Chang, LLC

(57) ABSTRACT

Techniques for automatically and efficiently controlling air conditioning units (ACUs) in a data center are provided. In one aspect, a method for controlling ACUs in a data center is provided. The method includes the following steps. It is identified which of the ACUs in the data center comprise base ACUs and which of the ACUs in the data center comprise redundant ACUs. Output from one or more of the redundant ACUs is increased in response to one or more control events. Output from the redundant ACUs is decreased once a predetermined period of time has elapsed without a new control event occurring.

26 Claims, 17 Drawing Sheets

(56) References Cited

U.S. PATENT DOCUMENTS

| | | | |
|---|---|---|---|
| 2003/0200050 A1* | 10/2003 | Sharma | F24F 11/006 702/132 |
| 2003/0221821 A1* | 12/2003 | Patel | F24F 11/001 165/247 |
| 2004/0240514 A1 | 12/2004 | Bash et al. | |
| 2006/0156749 A1* | 7/2006 | Lee | F24F 11/0012 62/228.1 |
| 2007/0012052 A1* | 1/2007 | Butler | F24F 11/0009 62/181 |
| 2007/0227710 A1* | 10/2007 | Belady | H05K 7/2079 165/122 |
| 2008/0178615 A1* | 7/2008 | Yoon | F24F 3/06 62/79 |
| 2008/0269932 A1* | 10/2008 | Chardon | G06T 11/206 700/98 |
| 2008/0288193 A1* | 11/2008 | Claassen | H05K 7/20836 702/61 |
| 2009/0056359 A1* | 3/2009 | Germagian | H05K 7/20836 62/259.2 |
| 2009/0222139 A1* | 9/2009 | Federspiel | F24F 11/006 700/278 |
| 2009/0292811 A1 | 11/2009 | Pienta et al. | |
| 2010/0085196 A1 | 4/2010 | Stiver et al. | |
| 2010/0299099 A1* | 11/2010 | Yamaoka | F24F 11/0001 702/130 |
| 2011/0016893 A1* | 1/2011 | Dawes | F25B 49/02 62/89 |
| 2011/0071687 A1 | 3/2011 | Uraki et al. | |
| 2011/0161968 A1 | 6/2011 | Bash et al. | |
| 2011/0195652 A1* | 8/2011 | Smith | F24F 11/008 454/184 |
| 2011/0203785 A1* | 8/2011 | Federspiel | G05D 22/02 165/200 |
| 2011/0250831 A1 | 10/2011 | Huang et al. | |
| 2012/0101648 A1* | 4/2012 | Federspiel | G05D 23/1934 700/291 |
| 2012/0203516 A1 | 8/2012 | Hamann et al. | |
| 2013/0047653 A1* | 2/2013 | Keisling | H05K 7/20827 62/228.1 |
| 2013/0176675 A1* | 7/2013 | Hundertmark | F24F 12/006 361/679.31 |
| 2013/0212443 A1* | 8/2013 | Ikegami | G06F 1/206 714/57 |
| 2013/0233532 A1* | 9/2013 | Imwalle | F28F 27/02 165/287 |
| 2013/0264044 A1* | 10/2013 | Kearney | F28F 27/00 165/200 |
| 2014/0297038 A1* | 10/2014 | Nishioka | G06F 1/206 700/275 |

FOREIGN PATENT DOCUMENTS

| | | |
|---|---|---|
| CN | 102116517 A | 7/2011 |
| JP | 2011129149 A | 6/2011 |

OTHER PUBLICATIONS

H.F. Hamann et al., "Uncovering energy-efficiency opportunities in data centers," IBM Journal of Research and Development, vol. 53, Issue 3, May 2009, pp. 10:1-10:12.

V. Lopez et al., "Measurement-based modeling for data centers," 12th IEEE Intersociety Conference on Thermal and Thermomechanical Phenomena in Electronic Systems (ITherm), Jun. 2-5, 2010.

H.F. Hamann et al., "Thermal zones for more efficient data center energy management," 12th IEEE Intersociety Conference on Thermal and Thermomechanical Phenomena in Electronic Systems (ITherm), Jun. 2-5, 2010.

English Abstract of CN102116517A dated Jul. 6, 2011 by Huajian Pan et al. (1 page).

English Abstract of CN201463149U dated May 12, 2010 by Li Lei et al. (1 page).

English Abstract of CN201421153Y dated Mar. 10, 2010 by Boyong He et al. (2 pages).

English Abstract of JP2011129149A dated Jun. 30, 2011 by Tashiro Kanji (2 pages).

\* cited by examiner

100

IMPLEMENTATION

| ACU STATUS | RELAY SENSOR | FLOW SENSOR |
|---|---|---|
| ON | OPEN | 100% |
| OFF | CLOSED | 0% |

IF POWER TO CONTROLLER IS DISRUPTED, RELAY WILL OPEN AND TURN ACU ON

FIG. 10

(A) T-EVENTS:

| # OF INLET TEMPERATURES ABOVE ACU THRESHOLD | EVENT WEIGHT | ACTION |
|---|---|---|
| LOWER THAN 1 | 0 | – |
| BETWEEN 2-3 | 1 | TURN 1 OF CLOSEST ACU ON |
| BETWEEN 4-5 | 2 | TURN 2 OF THE CLOSEST ACUs ON |
| BETWEEN 6-7 | 3 | TURN 3 OF THE CLOSEST ACUs ON |
| MORE THAN 7 | 4 | TURN ALL ACUs ON |

(B) P-EVENTS:

| # OF PRESSURE SENSORS BELOW ACU THRESHOLD | EVENT WEIGHT | ACTION |
|---|---|---|
| LOWER THAN 1 | 0 | – |
| 2 | 1 | TURN 1 OF CLOSEST ACU ON |
| 3 | 2 | TURN 2 OF THE CLOSEST ACUs ON |
| 4 | 3 | TURN 3 OF THE CLOSEST ACUs ON |
| 5 | 4 | TURN ALL ACUs ON |

(C) F-EVENTS:

| # OF FLOW SENSORS ON ACTIVE ACUs ARE "OFF" | EVENT WEIGHT | ACTION |
|---|---|---|
| 1 | 1 | TURN 1 OF CLOSEST ACU ON |
| 2 | 2 | TURN 2 OF THE CLOSEST ACUs ON |
| 3 | 3 | TURN 3 OF THE CLOSEST ACUs ON |
| MORE THAN 3 | 4 | TURN ALL ACUs ON |

(D) 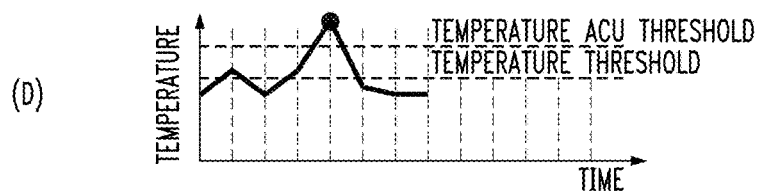

(E) 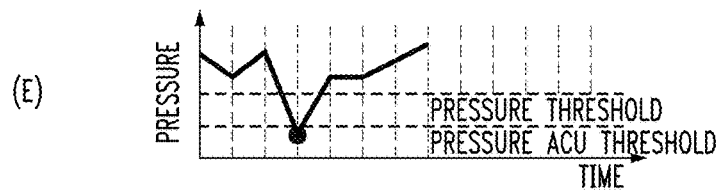

(F) 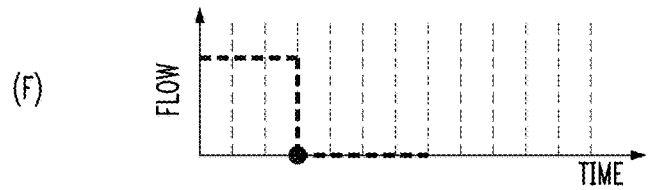

(G) 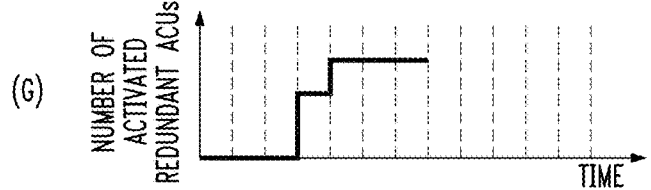

FIG. 11

ACU TURN ON EVENTS (N)

N-EVENTS:

(A)

| SCENARIO | EVENT WEIGHT | ACTION |
|---|---|---|
| MMT SERVER FAILS ONCE TO COMMUNICATE WITH A GIVEN RELAY | 0 | – |
| MMT SERVER FAILS 2 CONSECUTIVE TIMES TO COMMUNICATE WITH A GIVEN RELAY | 2 | RELAY WATCHDOG TURNS ALL ACUs ON PARTICULAR RELAY |
| MMT SERVER FAILS ONCE TO COMMUNICATE WITH A GIVEN DATA HUB | 0 | – |
| MMT SERVER FAILS 2 CONSECUTIVE TIMES TO COMMUNICATE WITH A GIVEN DATA HUB | 2 | TURN 2 OF THE CLOSEST ACUs ON |

(B) 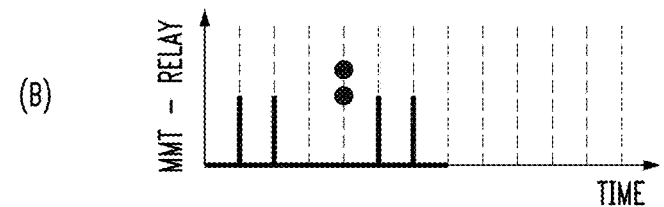

(C) 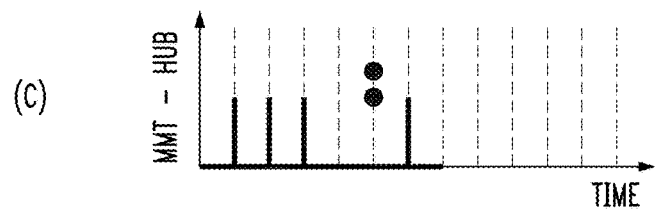

(D) 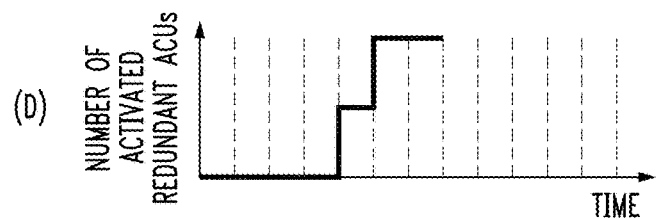

FIG. 12

ACU TURN ON EVENTS (S)
S(T)-EVENTS (TEMPERATURE SENSORS)

(A)

| SCENARIO | EVENT WEIGHT | ACTION |
|---|---|---|
| OUT OF RANGE SENSOR VALUE FOR A INLET TEMP SENSOR | 0 | – |
| TWO CONSECUTIVE OUT OF RANGE VALUES FOR MORE THAN 4 INLET TEMP SENSORS | 1 | TURN 1 OF CLOSEST ACU ON |
| TWO CONSECUTIVE OUT OF RANGE SENSOR VALUES FOR MORE THAN 8 INLET TEMP SENSORS | 2 | TURN 2 OF THE CLOSEST ACUs ON |
| TWO CONSECUTIVE OUT OF RANGE SENSOR VALUES FOR MORE THAN 12 INLET TEMP SENSORS | 3 | TURN 3 OF THE CLOSEST ACUs ON |
| TWO CONSECUTIVE OUT OF RANGE SENSOR VALUES FOR MORE THAN 18 INLET TEMP SENSORS | 4 | TURN ALL ACUs ON |

(B) 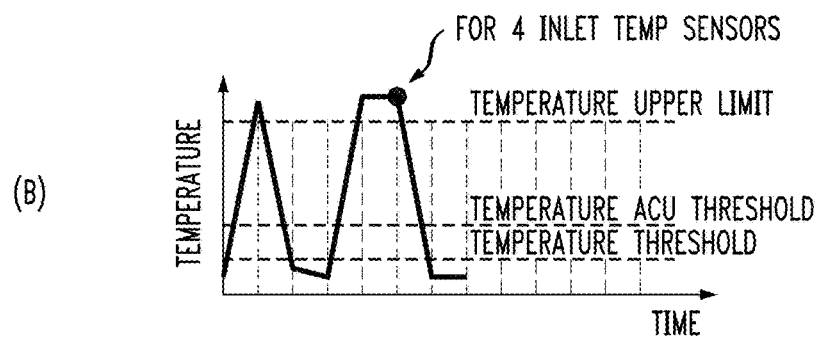

(C) 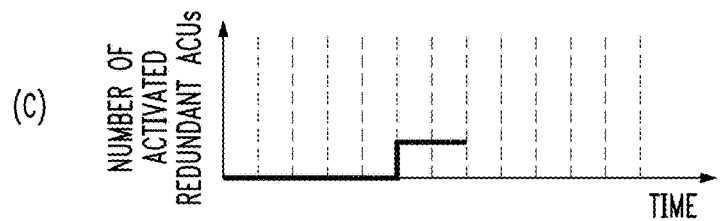

FIG. 13

ACU TURN ON EVENTS (S)
S(P)-EVENTS (PRESSURE SENSORS):

(A)

| SCENARIO | EVENT WEIGHT | ACTION |
|---|---|---|
| OUT OF RANGE SENSOR VALUE FOR A PRESSURE SENSOR | 0 | – |
| TWO CONSECUTIVE OUT OF RANGE SENSOR VALUES FOR MORE THAN 2 PRESSURE SENSORS | 1 | TURN 1 OF CLOSEST ACU ON |
| TWO CONSECUTIVE OUT OF RANGE SENSOR VALUES FOR MORE THAN 4 PRESSURE SENSORS | 2 | TURN 2 OF THE CLOSEST ACUs ON |
| TWO CONSECUTIVE OUT OF RANGE SENSOR VALUES FOR MORE THAN 6 PRESSURE SENSORS | 3 | TURN 3 OF THE CLOSEST ACUs ON |
| TWO CONSECUTIVE OUT OF RANGE SENSOR VALUES FOR MORE THAN 8 PRESSURE SENSORS | 4 | TURN ALL ACUs ON |

(B) 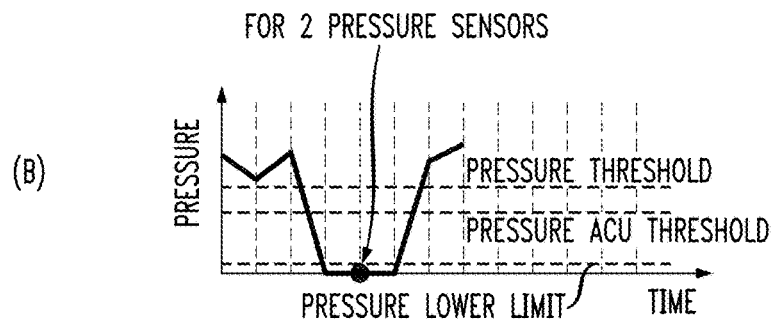

(C) 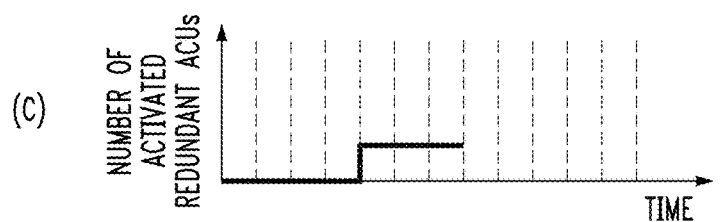

FIG. 14

(A) S(F)-EVENTS (FLOW SENSORS):

| SCENARIO | EVENT WEIGHT | ACTION |
|---|---|---|
| OUT OF RANGE SENSOR VALUE FOR A FLOW SENSOR | 0 | – |
| TWO CONSECUTIVE OUT OF RANGE SENSOR VALUES FOR 1 FLOW SENSOR | 1 | TURN 1 OF CLOSEST ACU ON |
| TWO CONSECUTIVE OUT OF RANGE SENSOR VALUES FOR 2 FLOW SENSOR | 2 | TURN 2 OF THE CLOSEST ACUs ON |
| TWO CONSECUTIVE OUT OF RANGE SENSOR VALUES FOR 3 FLOW SENSOR | 3 | TURN 3 OF THE CLOSEST ACUs ON |
| TWO CONSECUTIVE OUT OF RANGE SENSOR VALUES FOR 4 FLOW SENSOR | 4 | TURN ALL ACUs ON |

(B) 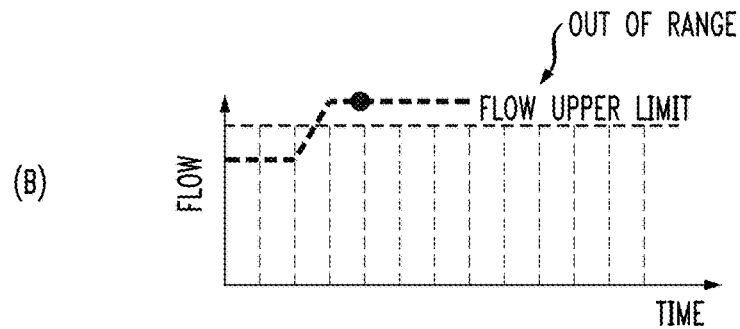

(C) 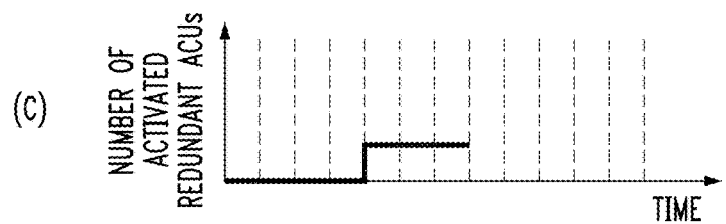

FIG. 15

S(R)-EVENTS (ACU SENSORS):

(A)

| SCENARIO | EVENT WEIGHT | ACTION |
|---|---|---|
| OUT OF RANGE SENSOR VALUE FOR A RELAY SENSOR | 0 | - |
| TWO CONSECUTIVE OUT OF RANGE SENSOR VALUES FOR 1 RELAY SENSOR | 1 | TURN 1 OF CLOSEST ACU ON |
| TWO CONSECUTIVE OUT OF RANGE SENSOR VALUES FOR 2 RELAY SENSOR | 2 | TURN 2 OF THE CLOSEST ACUs ON |
| TWO CONSECUTIVE OUT OF RANGE SENSOR VALUES FOR 3 RELAY SENSOR | 3 | TURN 3 OF THE CLOSEST ACUs ON |
| TWO CONSECUTIVE OUT OF RANGE SENSOR VALUES FOR 4 RELAY SENSOR | 4 | TURN ALL ACUs ON |

(B) 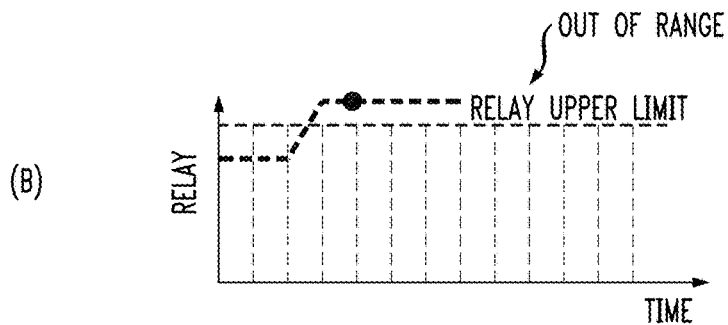

(C) 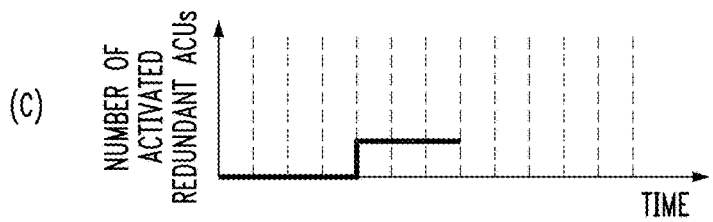

FIG. 16

ACU TURN ON EVENT(S)
S(RS)-EVENTS (ACU SENSOR - STATUS):

(A)

| SCENARIO | EVENT WEIGHT | ACTION |
|---|---|---|
| 0 INCONSISTENCIES BETWEEN RELAY SENSORS AND STATUS | 0 | – |
| 1 INCONSISTENCY BETWEEN RELAY SENSOR AND STATUS | 1 | TURN 1 OF CLOSEST ACU ON |
| 2 INCONSISTENCIES BETWEEN RELAY SENSOR AND STATUS | 2 | TURN 2 OF THE CLOSEST ACUs ON |
| 3 INCONSISTENCIES BETWEEN RELAY SENSOR AND STATUS | 3 | TURN 3 OF THE CLOSEST ACUs ON |
| 4 INCONSISTENCIES BETWEEN RELAY SENSOR AND STATUS | 4 | TURN ALL ACUs ON |

(B) 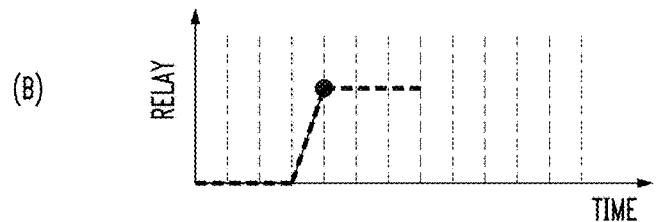

(C) 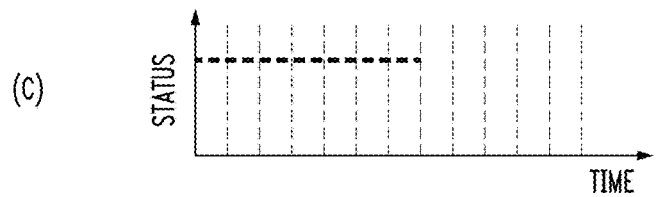

(D) 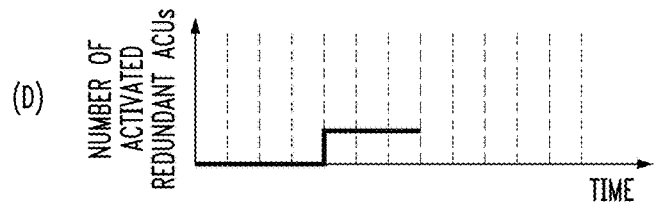

ACU SENSOR

| ACU STATUS | RELAY IS: | FLOW SENSOR |
|---|---|---|
| ON | OPEN | 100% |
| OFF | CLOSED | 0% |

FIG. 17

ACU TURN ON EVENTS (S)

S(FS)-EVENTS (FLOW SENSOR - STATUS):

(A)

| SCENARIO | EVENT WEIGHT | ACTION |
|---|---|---|
| 0 INCONSISTENCIES BETWEEN FLOW SENSOR AND STATUS | 0 | - |
| 1 INCONSISTENCY BETWEEN FLOW SENSOR AND STATUS | 1 | TURN 1 OF CLOSEST ACU ON |
| 2 INCONSISTENCIES BETWEEN FLOW SENSOR AND STATUS | 2 | TURN 2 OF THE CLOSEST ACUs ON |
| 3 INCONSISTENCIES BETWEEN FLOW SENSOR AND STATUS | 3 | TURN 3 OF THE CLOSEST ACUs ON |
| 4 INCONSISTENCIES BETWEEN FLOW SENSOR AND STATUS | 4 | TURN ALL ACUs ON |

(B) 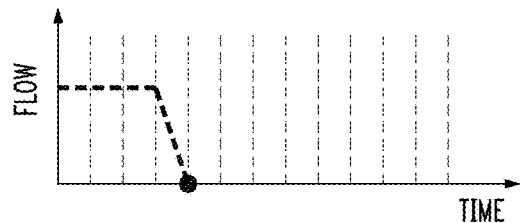

(C) 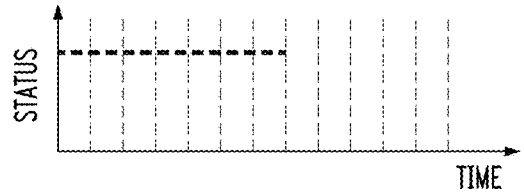

(D) 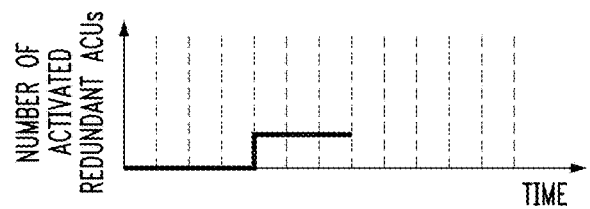

| ACU STATUS | RELAY SENSOR | FLOW SENSOR |
|---|---|---|
| ON | OPEN | 100% |
| OFF | CLOSED | 0% |

FIG. 18

ACU TURN ON EVENTS (S)

S(RF)-EVENTS (RELAY SENSOR - FLOW SENSOR):

(A)

| SCENARIO | EVENT WEIGHT | ACTION |
|---|---|---|
| 0 INCONSISTENCY BETWEEN RELAY AND FLOW SENSOR | 0 | – |
| 1 INCONSISTENCY BETWEEN RELAY AND FLOW SENSOR | 1 | TURN 1 OF CLOSEST ACU ON |
| 2 INCONSISTENCIES BETWEEN RELAY AND FLOW SENSOR | 2 | TURN 2 OF THE CLOSEST ACUs ON |
| 3 INCONSISTENCIES BETWEEN RELAY AND FLOW SENSOR | 3 | TURN 3 OF THE CLOSEST ACUs ON |
| 4 INCONSISTENCIES BETWEEN RELAY AND FLOW SENSOR | 4 | TURN ALL ACUs ON |

(B) 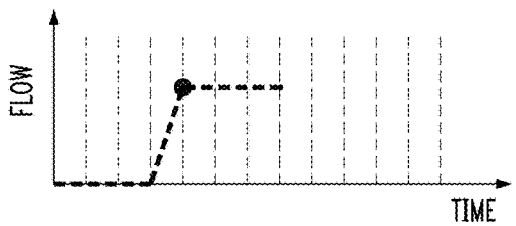

(C) 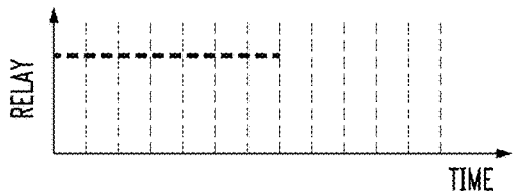

(D) 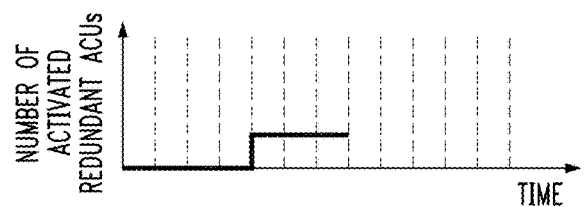

| ACU STATUS | RELAY IS: | FLOW SENSOR |
|---|---|---|
| ON | OPEN | 100% |
| OFF | CLOSED | 0% |

# AUTOMATIC COMPUTER ROOM AIR CONDITIONING CONTROL METHOD

FIELD OF THE INVENTION

The present invention relates to data centers, and more particularly, to techniques for automatically and efficiently controlling air conditioning units (ACUs) in a data center.

BACKGROUND OF THE INVENTION

Data center cooling has become a problem of increasing interest as the number of servers and the power each server consumes has been rapidly increasing to meet the increasing demands of computation, transaction processing, telecommunications, and interne usage. With rising energy costs and new incentives for "green" energy use, efficiency has become an important issue.

Data centers are often cooled using air conditioning units or ACUs. Typically, data centers are over-provisioned with ACUs where the capacity of the ACUs far exceeds the cooling needs of the data center. Operating too many ACUs in the data center wastes enormous amounts of energy and adds to the heat load of the data center.

Therefore, techniques for regulating ACU usage in a data center to minimize or eliminate wasteful over-provisioning of cooling and thereby increasing efficiency the data center cooling system would be desirable.

SUMMARY OF THE INVENTION

The present invention provides techniques for automatically and efficiently controlling air conditioning units (ACUs) in a data center. In one aspect of the invention, a method for controlling ACUs in a data center is provided. The method includes the following steps. It is identified which of the ACUs in the data center comprise base ACUs and which of the ACUs in the data center comprise redundant ACUs. Output from one or more of the redundant ACUs is increased in response to one or more control events. Output from the redundant ACUs is decreased once a predetermined period of time has elapsed without a new control event occurring.

A more complete understanding of the present invention, as well as further features and advantages of the present invention, will be obtained by reference to the following detailed description and drawings.

BRIEF DESCRIPTION OF THE DRAWINGS

FIG. 10A is a diagram illustrating exemplary temperature or T-events and respective actions according to an embodiment of the present invention;

FIG. 10B is a diagram illustrating exemplary pressure or P-events and respective actions according to an embodiment of the present invention;

FIG. 10C is a diagram illustrating exemplary flow or F-events and respective actions according to an embodiment of the present invention;

FIG. 10D is a diagram graphical depicting exemplary T-events according to an embodiment of the present invention;

FIG. 10E is a diagram graphical depicting exemplary P-events according to an embodiment of the present invention;

FIG. 10F is a diagram graphical depicting exemplary F-events according to an embodiment of the present invention;

FIG. 10G is a diagram graphical depicting the number of activated—turned on—(redundant) ACUs based on the exemplary T, P and F-events according to an embodiment of the present invention;

FIG. 11A is a diagram illustrating exemplary network or N-events including MMT server—relay or control module communication failures and MMT server—data hub communication failures and respective actions according to an embodiment of the present invention;

FIG. 11B is a diagram graphical depicting exemplary N-events, in this case MMT server—relay communication failures, according to an embodiment of the present invention;

FIG. 11C is a diagram graphical depicting exemplary N-events, in this case MMT server—data hub communication failures, according to an embodiment of the present invention;

FIG. 11D is a diagram graphical depicting the number of activated—turned on—(redundant) ACUs based on the exemplary N-events shown in FIGS. 11B and 11C according to an embodiment of the present invention;

FIG. 12A is a diagram illustrating exemplary sensor or S(T)-events where one or more (inlet) temperature sensor values are out of range according to an embodiment of the present invention;

FIG. 12B is a diagram graphical depicting exemplary S(T)-events where one or more (inlet) temperature sensor values are out of range according to an embodiment of the present invention;

FIG. 12C is a diagram graphical depicting the number of activated—turned on—(redundant) ACUs based on the exemplary S(T)-events shown in FIG. 12B according to an embodiment of the present invention;

FIG. 13A is a diagram illustrating exemplary sensor or S(P)-events where one or more sub-floor plenum pressure sensor values are out of range according to an embodiment of the present invention;

FIG. 13B is a diagram graphical depicting exemplary S(P)-events where one or more sub-floor plenum pressure sensor values are out of range according to an embodiment of the present invention;

FIG. 13C is a diagram graphical depicting the number of activated—turned on—(redundant) ACUs based on the exemplary S(P)-events shown in FIG. 13B according to an embodiment of the present invention;

FIG. 14A is a diagram illustrating exemplary sensor or S(F)-events where one or more air flow sensor values are out of range according to an embodiment of the present invention;

FIG. 14B is a diagram graphical depicting exemplary S(F)-events where one or more air flow sensor values are out of range according to an embodiment of the present invention;

FIG. 14C is a diagram graphical depicting the number of activated—turned on—(redundant) ACUs based on the exemplary S(F)-events shown in FIG. 14B according to an embodiment of the present invention;

FIG. 15A is a diagram illustrating exemplary sensor or S(R)-events where one or more ACU sensor values are out of range according to an embodiment of the present invention;

FIG. 15B is a diagram graphical depicting exemplary S(R)-events where one or more ACU sensor values are out of range according to an embodiment of the present invention;

FIG. 15C is a diagram graphical depicting the number of activated—turned on—(redundant) ACUs based on the exemplary S(R)-events shown in FIG. 15B according to an embodiment of the present invention;

FIG. 16A is a diagram illustrating exemplary status of ACU sensor or S(RS)-events where an inconsistency exists between ACU sensor data and ACU status according to an embodiment of the present invention;

FIG. 16B is a diagram graphical depicting ACU sensor data according to an embodiment of the present invention;

FIG. 16C is a diagram graphical depicting ACU status according to an embodiment of the present invention;

FIG. 16D is a diagram graphical depicting the number of activated—turned on—(redundant) ACUs based on the exemplary S(RS)-events—inconsistencies between the data shown in FIGS. 16B and 16C according to an embodiment of the present invention;

FIG. 17A is a diagram illustrating exemplary status of flow sensor or S(FS)-events where an inconsistency exists between flow sensor data and ACU status according to an embodiment of the present invention;

FIG. 17B is a diagram graphical depicting flow sensor data according to an embodiment of the present invention;

FIG. 17C is a diagram graphical depicting ACU status according to an embodiment of the present invention;

FIG. 17D is a diagram graphical depicting the number of activated—turned on—(redundant) ACUs based on the exemplary S(FS)-events—inconsistencies between the data shown in FIGS. 17B and 17C according to an embodiment of the present invention;

FIG. 18A is a diagram illustrating exemplary ACU-Flow sensor or S(RF)-events where an inconsistency exists between ACU sensor data and flow sensor data according to an embodiment of the present invention;

FIG. 18B is a diagram graphical depicting flow sensor data according to an embodiment of the present invention;

FIG. 18C is a diagram graphical depicting ACU sensor data according to an embodiment of the present invention;

FIG. 18D is a diagram graphical depicting the number of activated—turned on—(redundant) ACUs based on the exemplary S(RF)-events—inconsistencies between the data shown in FIGS. 18B and 18C according to an embodiment of the present invention;

DETAILED DESCRIPTION OF PREFERRED EMBODIMENTS

As provided above, many computer rooms are over provisioned with air conditioning units (ACUs) which wastes enormous amounts of energy and adds to the heat load of the data center. The present techniques address this common problem and provide a sensible way to automatically control (e.g., fan speed) or shutdown redundant cooling units. These units may be brought back on line almost instantly if circumstances warrant.

As will be described in detail below, the present techniques can be employed in conjunction with Measurement and Management Technologies (MMT) which provides continuous measurements of temperature, relative humidity, pressure, flow, power, current, and other physical variables (e.g., air quality) in a data center. In fact, some data centers may already be equipped with MMT which makes implementation of the present techniques that much more easy.

MMT is a technology for optimizing data center infrastructures for improved energy and space efficiency which involves a combination of advanced metrology techniques for rapid measuring/surveying data centers (see, for example, U.S. Pat. No. 7,366,632, issued to Hamann et al., entitled "Method and Apparatus for Three-Dimensional Measurements," the contents of which are incorporated by reference herein) and physics-based modeling techniques for optimizing a data center facility within a given thermal envelope for optimum space and most-efficient energy utilization (see, for example, U.S. Application Publication Number 2008/0288193 A1, filed by Claassen et al., entitled "Techniques for Analyzing Data Center Energy Utilization Practices," the contents of which are incorporated by reference herein).

In general, the MMT measurements can be used to deduce that possibly too many ACUs are on, wasting power and contributing additional heat load to the room. These so called redundant ACUs can be automatically turned off or scaled back (e.g., the fan speed of the redundant ACUs can be reduced—see below) using a set of rules imbedded in MMT or other exemplary apparatus for (automatically) controlling ACUs. By comparison, today most data centers would rely on human intervention to change ACU settings. Using the present techniques, the redundant ACUs are systematically turned off or the fan speed is reduced in a safe (i.e., so as not to create an environment harmful to IT equipment in the data center—see below) and beneficial way.

Figure 1:
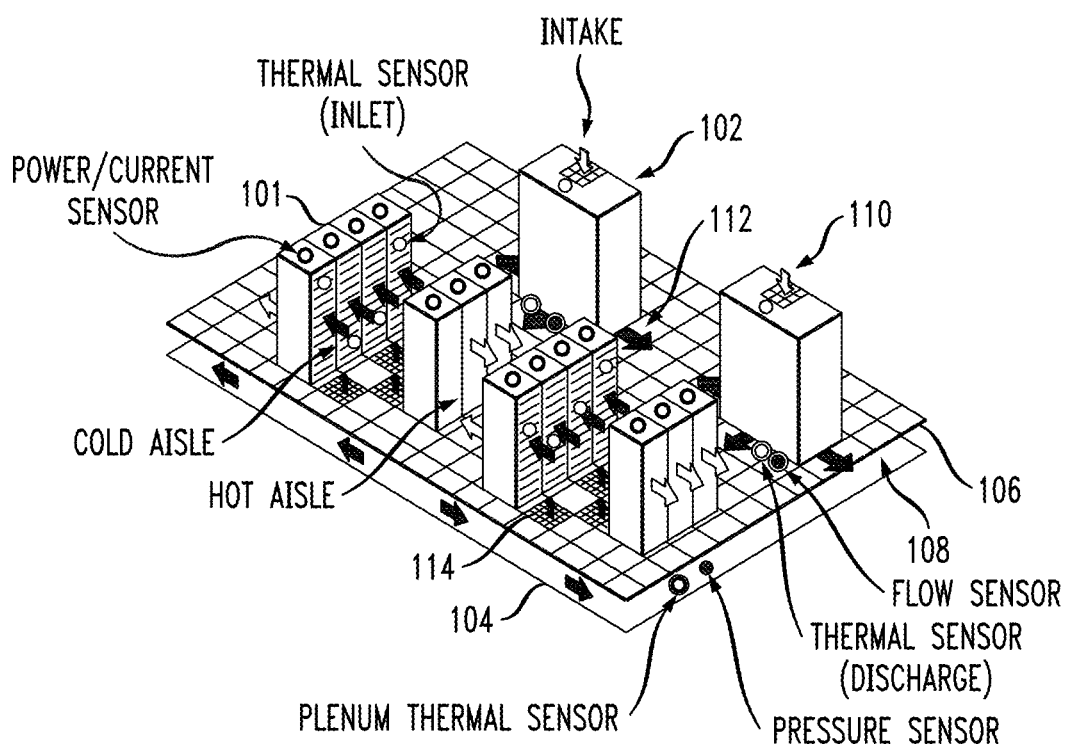
FIG. 1 is a diagram illustrating an exemplary data center according to an embodiment of the present invention.

Prior to describing the present techniques, an exemplary data center for which the present techniques may be implemented is now described. FIG. 1 is a diagram illustrating exemplary data center 100. While the present techniques are described herein in the context of a raised floor data center, this is merely an example. The present techniques are equally applicable to non-raised floor data centers, and more generally to any indoor space cooled using ACUs. Data center 100 has information technology (IT) racks 101 and a raised-floor cooling system with air conditioning units (ACUs) 102 (also referred to herein as computer room air conditioners (CRACs), see below) that take hot air in (typically from above through one or more air returns in the CRACs) and exhaust cooled air into a sub-floor plenum below. The sub-floor plenum may also be referred to herein simply as the "plenum." Hot air flow through data center 100 is indicated by light arrows 110 and cooled air flow through data center 100 is indicated by dark arrows 112.

In FIG. 1, IT racks 101 use front-to-back cooling and are located on raised-floor 106 with sub-floor 104 beneath. Namely, according to this scheme, cooled air is drawn in through a front (inlet) side of each rack and warm air is exhausted out from a rear (outlet) side of each rack. The cooled air drawn into the front of the rack is supplied to air inlets of each IT equipment component (servers for example) therein. Space between raised floor 106 and sub-floor 104 defines the sub-floor plenum 108. The sub-floor plenum 108 serves as a conduit to transport, e.g., cooled air from the ACUs 102 to the racks. In a properly-organized data center (such as data center 100), racks 101 are arranged in a hot aisle—cold aisle configuration, i.e., having air inlets and exhaust outlets in alternating directions. Namely, cooled air is blown through perforated floor tiles 114 in raised-floor 106, from the sub-floor plenum 108 into the cold aisles. The cooled air is then drawn into racks 101, via the air inlets, on an air inlet side of the racks and dumped, via the exhaust outlets, on an exhaust outlet side of the racks and into the hot aisles.

The ACUs typically receive chilled water from a refrigeration chiller plant (not shown), also referred to herein simply as a "chiller." Each ACU typically includes a blower motor to circulate air through the ACU and to blow cooled air, e.g., into the sub-floor plenum. In some cases, the fan speed of the ACU blower motor (or simply blower) can be controlled so as to increase/decrease the output from the ACU. In other cases, the fan speed of the ACUs cannot be controlled and the output of the ACUs is regulated (increased/decreased) by turning ACUs on/off (e.g., on a unit-by-unit basis). The overall implementation of the present techniques is the same regardless of whether or not variable fan speed technology is available. As will be described in detail below, the only difference is in the granularity of the ACU adjustments. For instance, with variable fan speed technology, there is simply a greater number of cooling levels that can be implemented for each ACU (versus just turning the ACU on or off). In most data centers, the ACUs are simple heat exchangers mainly consuming power needed to blow the cooled air into the sub-floor plenum. Coolant distribution units (CDUs) (not shown) can be employed at the interface between the chiller and the ACUs. In general, a CDU includes a heat exchanger and one or more circulating pumps to circulate the chilled water through the ACUs. Thus, the CDUs contribute to the overall power consumption in the data center.

Typically, one or more power distribution units (PDUs) (not shown) are present that distribute power to the IT equipment racks 101. In general, since the PDUs supply electrical power required by the IT equipment in a data center, a total electrical power intake of the PDUs represents an important parameter in determining the energy efficiency of a data center. According to an exemplary embodiment, each of the PDUs is outfitted with commercially available power and current sensors which measure the electric power drawn by each of the PDUs.

Uninterruptable power supplies or UPS (not shown) are also typically implemented in a data center to protect the IT equipment in the event of a power disruption so as to prevent data loss (i.e., UPS provides short term power when the power source fails). As is known in the art, the UPSs might also correct common utility power issues, such as voltage spikes.

The pressure differential between the "pressurized" sub-floor plenum and the raised floor is measured with a pressure sensor(s) (see sensor labeled "pressure sensor" in FIG. 1). In the case of a non-raised floor data center, pressure sensors can be deployed, for example, in the cooling ducts. According to an exemplary embodiment, multiple pressure sensors are employed throughout the plenum. The cold air delivered from the ACUs through the sub-floor plenum cools the servers. Thermal temperatures at the inlet (Tin) of the servers monitor the inlet temperatures of the servers in the racks, and in this example are measured using inlet thermal sensors (see sensors labeled "thermal sensor (inlet)" in FIG. 1, which are present at the air inlet sides of the racks). The heated air from the exhaust of the server is then returned to the ACUs, where it is cooled and discharged into the sub-floor plenum. The return (or intake) temperature (TR) to the ACUs, discharge temperature (TD) as well as the air flow of each ACU are monitored. In the example shown in FIG. 1, the return temperature (TR) is measured using inlet thermal sensors, the discharge temperature of each of the ACUs is measured using a discharge thermal sensor (labeled "thermal sensor (discharge)") and the air flow of each of the ACUs is measured using a flow sensor (labeled "flow sensor"). In the example shown in FIG. 1, the electric power drawn by the racks is measured using power and current sensors (labeled "power/current sensor") located at each of the racks. Temperature in the plenum is measured using a plenum thermal sensor (labeled "plenum thermal sensor"). The use of a plenum thermal sensor(s) is optional, since readings of the plenum temperature may be obtained from the thermal sensors (discharge) (see FIG. 1). When equipped with both plenum thermal sensors and thermal sensors (discharge), then the plenum temperature may be determined based on a composite of the readings from all of these thermal sensors. Thermal, air flow, pressure, and power/current sensors are commercially available. These sensors can provide measurement data in real time, which as described below is used in the present modeling techniques.

As highlighted above, the present techniques allow (automatically) controlling ACUs in an indoor environment, such as a data center. See methodology 200 of FIG. 2. While the following description utilizes the exemplary scenario of cooling in the context of a data center, as provided above the present techniques are generally applicable to any indoor environment, including but not limited to buildings, dwellings or any portions thereof. Further, as provided above, the present techniques are broadly applicable to either a scenario in which changes in the cooling level are achieved simply by turning individual ACUs on or off (e.g., on a unit-by-unit basis)—also referred to herein as "on/off control," or one in which variable fan speed technology is present (also referred to herein as "fan speed control") thus permitting different levels of cooling through regulating the fan speed of the blower motor. Namely, the same on/off control techniques can be applied to increase or decrease the fan speed. The only difference between on/off control and fan speed control is that there are more levels for fan speed controls. Using a non-limiting example to illustrate this point, assume that (by way of the present techniques) it is determined that there are four redundant ACUs in the data center. With on/off control four different cooling levels can be realized with none of the ACUs running at the low end (minimum cooling) and all four ACUs running at the high end (maximum cooling). By comparison, with fan speed control, many more cooling levels can be realized as each ACU can be adjusted to multiple cooling levels (rather than just on or off). For example, if someone decides to increment the cooling by 10% there could be 40 different cooling levels defined and the cooling system would be able to respond on a much finer scale to the events. In such an implementation of fan speed control the configuration parameters of the present techniques would just be adjusted to the desired cooling levels.

The operation of ACUs consumes a significant fraction of energy in buildings, data centers, etc. For example, in a data center the energy consumption of the air conditioning units can easily amount to 20-30% of the total energy consumption of the facility. In a data center, such as data center 100, multiple ACUs are used which are distributed throughout the facility. The numbers of ACUs should be basically governed by the heat load and the required redundancy. The required redundancy can be based on a particular application and redundancy philosophy. By way of example only, some data centers employ a n+1 redundancy philosophy. Although systems configured based on more stringent redundancy philosophies, such as 2(n+1) are becoming more common. The concept of n+1 redundancy is known to those of skill in the art and thus is not described further herein. An average ACU utilization v (for all ACUs) is given by:

$$v = P_{RF}/\#_{ACU} P_{cap} \qquad (1)$$

wherein $P_{RF}$ is the total heat load, #ACU is the number of active ACUs, and $P_{cap}$ is the cooling capacity of each of the ACUs. For simplicity it is assumed here that all of the ACUs are the same and thus can be operated here with average numbers rather than accounting for each ACU individually. Methods to estimate or calculate $P_{RF}$ are described, for example, in U.S. patent application Ser. No. 13/791,140, filed by Hamann et al., entitled "Real-Time Modeling of Heat Distributions," the entire contents of which are incorporated by reference herein. It is noted that the aforementioned power/current sensors (see FIG. 1, described above) are employed to calculate the total heat load.

Most data centers operate with very low utilization levels (about 40%) because of uneven distributions of heat load within the center, but also because of "perceived" redundancy requirements. In essence, data center managers tend to operate an excessively large number of "redundant" ACUs in order to provide additional protection in case of a thermal emergency. This scenario can be extremely inefficient.

In step 202, unlike conventional approaches, the present techniques identify the utilization levels v' of each of the ACUs in the indoor environment using:

$$v^i = P_{cool}^i / P_{cap}^i, \qquad (2)$$

wherein $P_{cool}^i$ is the removed power (i.e., the removed heat) by this respective ACU i. This notion of removed power/ removed heat comes from the principle of energy balance. For example, the servers produce heat [W] and the ACUs remove the heat [W]. Methods for obtaining and measuring $P_{cool}^i$ are described, for example, in Y. Joshi and P. Kumar (eds.), Energy Efficient Thermal Management of Data Centers, DOI 10.1007/978-1-4419-7124-1_7, Springer Science+ Business Media, LLC (Published Mar. 19, 2012), the entire contents of which are incorporated by reference herein.

Figure 2:
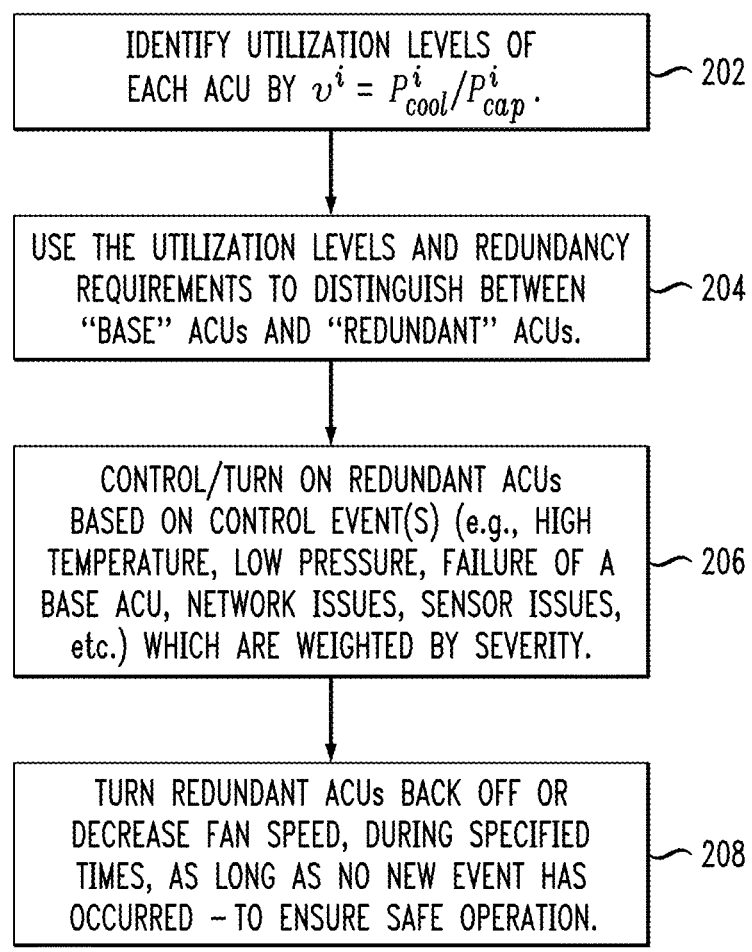
FIG. 2 is a diagram illustrating an exemplary methodology for (automatically) controlling air conditioning units (ACUs) in an indoor environment, such as a data center according to an embodiment of the present invention.

Based on the determination of utilization levels $v^i$ of each of the ACUs in step 202 and basic redundancy requirements, in step 204 of FIG. 2, "base" ACUs are distinguished from "redundant" ACUs. According to the present techniques, redundant ACUs will be controlled while base ACUs will be operated continuously to ensure safe operation of the data center. Thus, the present techniques serve to control operation of the redundant ACUs. The redundant ACUs will be operated in a stand-by mode, where the redundant ACUs will remain idle/off (or run at very low fan speeds) until they are needed. By way of example only, in the case where fan speed control is present and the fan blower motor can be operated at multiple fan speed setting, then in this example the redundant ACUs can be set to the lowest fan speed setting. Thus, for instance, if there are four different fan speed settings 1-4 ranging from lowest to highest, then the redundant ACUs can be set at setting 1 (the lowest fan speed setting). A controller (e.g., which can employ a failsafe relay—see description below) will be used as a "watch dog" to return the idle redundant ACUs to action when the situation warrants. The advantages of the present techniques are threefold, the present techniques ensure 1) maximum benefit of the control scheme by targeting low utilized ACUs (redundant ACUs), 2) minimum investment by reducing the numbers of controlled ACUs, and minimum reliance on the control scheme for mission critical operations—since the base ACUs will not be controlled by the process.

It is notable that the particular ACUs that are determined to be "base" and "redundant" ACUs in step 204 can change over time depending on changes in the data center conditions. Thus, a given ACU might in some situations be considered to be a base ACU, and in other situations that same given ACU might be considered to be a redundant ACU. For instance, this assignment of an ACU as being either a base or a redundant ACU can change over time because if the heatload increases and/or the data center changes, then $P_{cool}^i$ will change.

In step 206, the redundant ACUs are controlled/turned on based on a control event(s). As will be described in detail below, these control events include, but are not limited to, excessive/high temperature, excessively low pressure, airflow, the failure of one or more of the base ACUs, network issues (e.g., communication failures within the network), sensor issues (e.g., out of range sensor values), etc. The events are weighted by severity.

Accordingly, the present techniques utilize a combination of pressure, temperature and flow sensing across the data center or building to realize the control. Conventional techniques have never used the combination of these three physical parameters to control an ACU.

In step 208, redundant ACUs are turned back off or, in the case where fan speed control is available, the fan speed is decreased, during specified times (e.g., weekdays from 7 am to 5 pm), as long as no new event has occurred. As provided above, when fan speed control is available, the redundant ACUs may be kept at the lowest fan setting (rather than turning them off completely). In that case, by way of example only, in step 208 the redundant ACUs can be set back down to the lowest fan speed setting.

These procedures for reducing the cooling are to insure that safe temperatures or other parameters of interest, e.g., pressure, are maintained at all times. Namely, the present process uses different control schemes for increasing the cooling vs. decreasing the cooling (e.g., turning ACUs on vs. off or increasing vs. decreasing the fan speed). In essence the process is more likely to increase cooling, which provides additional safety to the operation of the control scheme.

Figure 3:
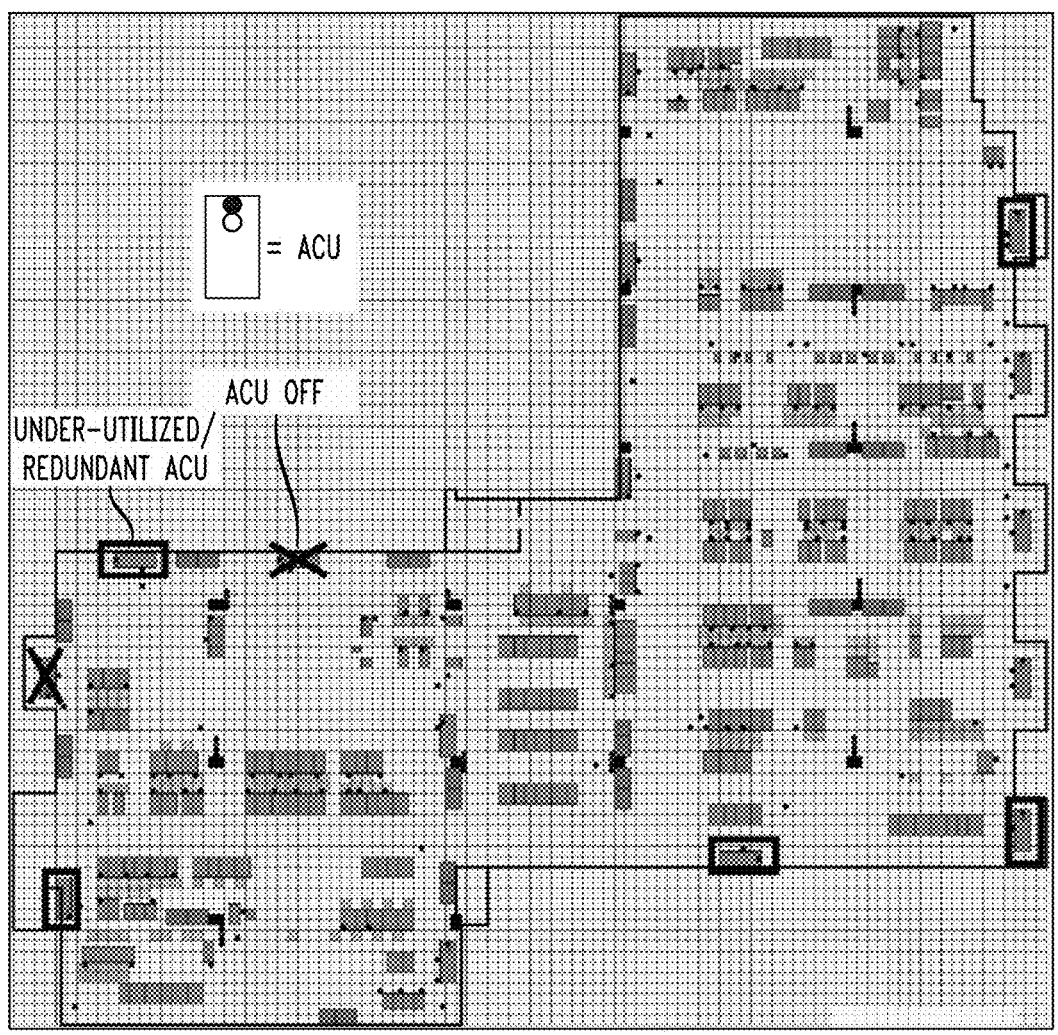
FIG. 3 is a diagram illustrating an exemplary data center layout wherein some of the ACUs are being underutilized according to an embodiment of the present invention.
Figure 3:
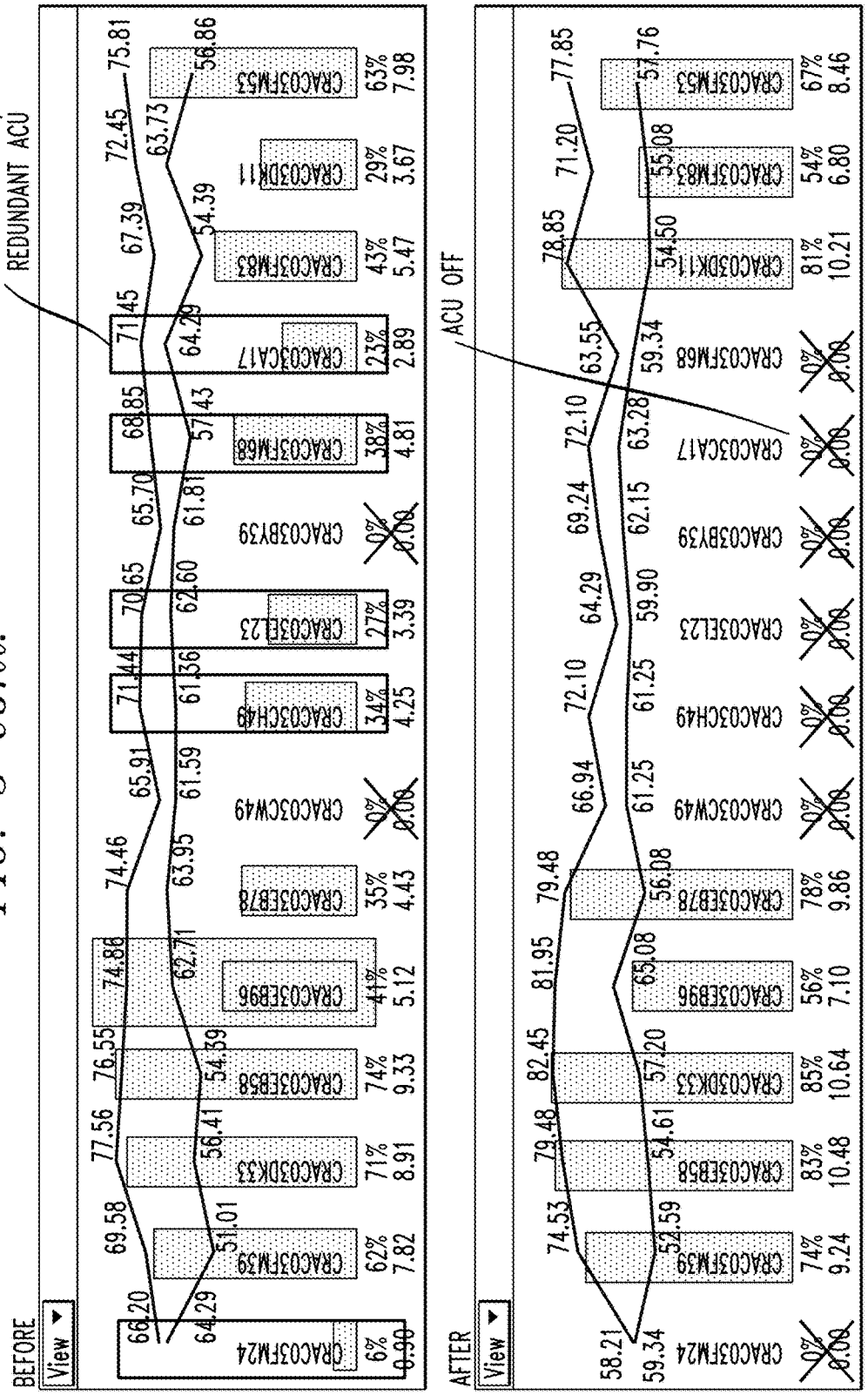

The steps of methodology 200 are now described in detail. FIG. 3 is a diagram illustrating an exemplary data center layout. In the layout, five of the 15 ACUs in the data center are being highlighted using bold rectangles. These five ACUs are (according to this data center set-up) being underutilized (even potentially having negative efficiency)—see ACU utilization shown in the middle section of FIG. 3 as a bar plot (taller bars signify higher ACU utilization). These five ACUs may pump warm air under the floor, thus having negative efficiency. The determination of redundant ACUs can be based simply on the utilization metric of each ACU, where the lowest utilized, as described next, ACUs are picked first. One would typically look at utilization for a prolonged period of time (e.g., from about few hours to several days) and select the lowest utilized ACUs recursively, i.e., start turning off or controlling one at a time until a certain parameter, e.g., return temperature, reaches an inflection point or a minimum setpoint, e.g., plenum pressure—FIG. 6 and FIG. 7 below illustrate an optimum operating point. Another consideration should be the layout of the ACUs in the space, i.e., the distribution of the remaining operating ACUs should be somewhat equally spaced based on the cooling zones of each ACU, as described next. For instance, the cooling provided by the operating ACUs should cover an area for which cooling is needed. Techniques for determining cooling "zones of influence" or the areas affected by the cooled air flow from the ACUs is described, for example, in U.S. Patent Application Publication Number 20120203516 filed by Hamann et al., entitled "Techniques for Determining Physical Zones of Influence," the entire contents of which are incorporated by reference herein. Thus, it may be desirable to have the ACUs which are operating be those that collectively have zones of influence servicing the entire data center. FIG. 3 shows also the utilization levels of each ACU after 5 additional ACUs were turned off.

Figure 4:
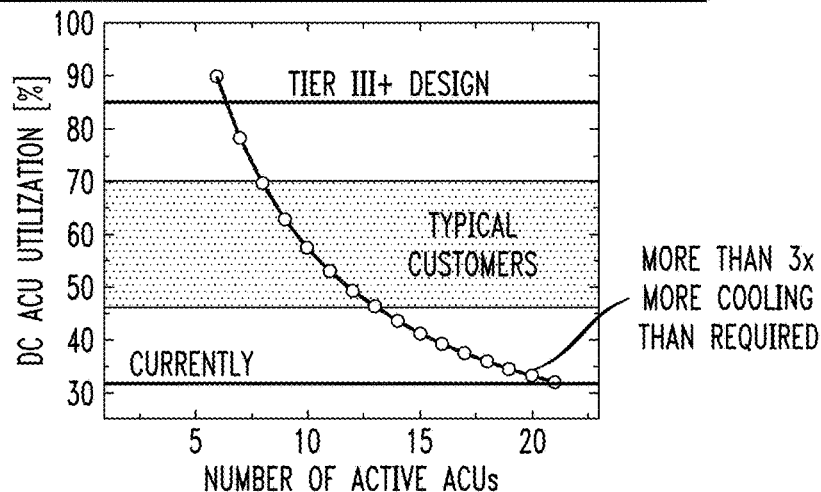
FIG. 4 is a diagram illustrating ACU utilization as a function of the number of operating ACUs according to an embodiment of the present invention.

FIG. 4 is a diagram illustrating ACU utilization (percentage utilization) for the number of ACUs on (# of active ACUs) in another different data center (DC), one which has in total 21 ACUs. As shown in FIG. 4, far more cooling is on than is required, by a large margin (i.e., in the example shown, more than three times the cooling is being provided than is required). It is also shown that a data center with a tier III+design target would require 85% utilization, which suggests that the data center could be operating with only 7 ACUs rather than with all 21 ACUs.

Figure 5:
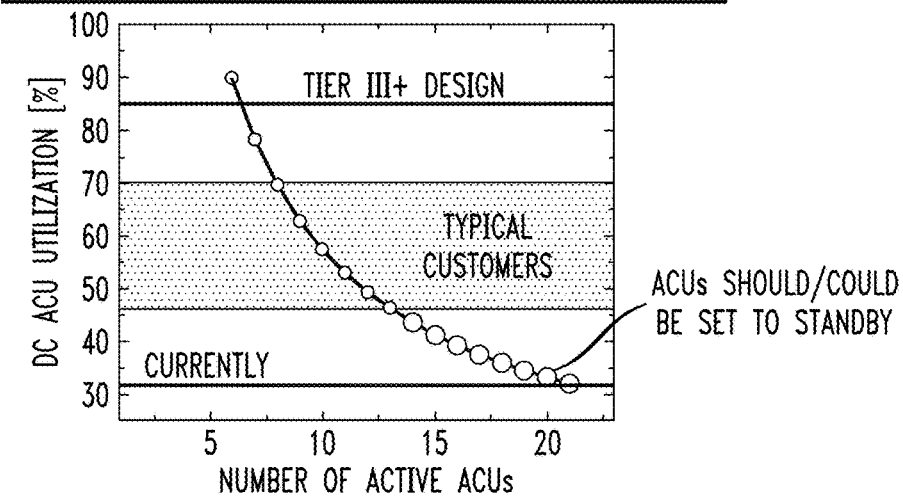
FIG. 5 is a diagram illustrating that for an exemplary data center the underutilized/redundant ACUs can be set to standby mode and even then there will be more than twice the cooling capacity than is required according to an embodiment of the present invention.

FIG. 5 is a diagram illustrating that, in this example, the eight underutilized (referred to herein as "redundant") ACUs can be set to standby mode (i.e., wherein they are turned off—but could be turned on automatically according to the present techniques based on a control event—see below) and even then there will be more than twice the cooling capacity then is required. Thus, in this case the number of active ACUs would be reduced from 21 to 13. In FIG. 5 the underutilized ACUs are determined simply by identifying the 8 lowest-utilized ACUs as described above.

Figure 6:
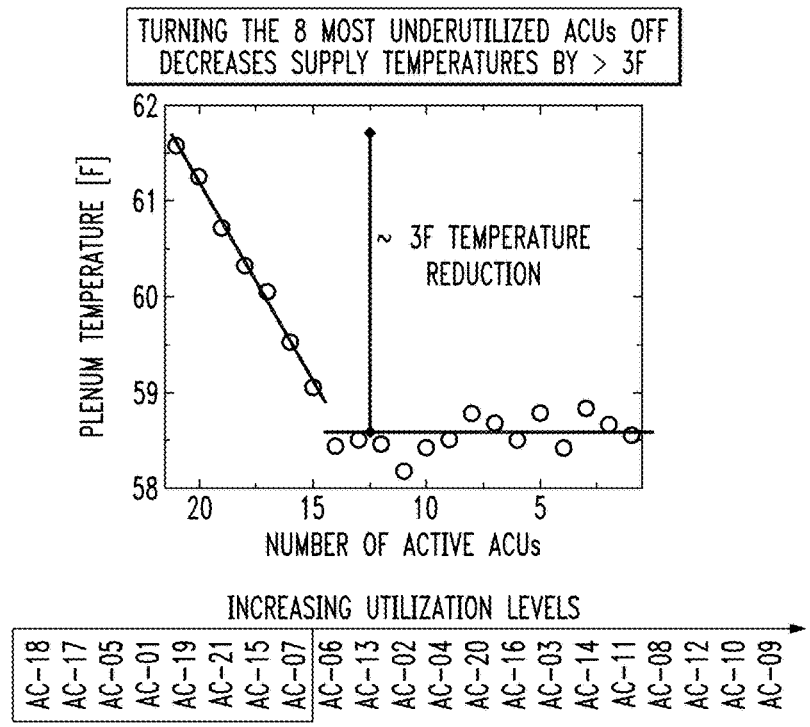
FIG. 6 is a diagram illustrating how turning off the redundant, i.e., most underutilized, ACUs in the data center can decrease the supply temperature (measured as temperature in the sub-floor plenum in the data center) according to an embodiment of the present invention.
Figure 7:
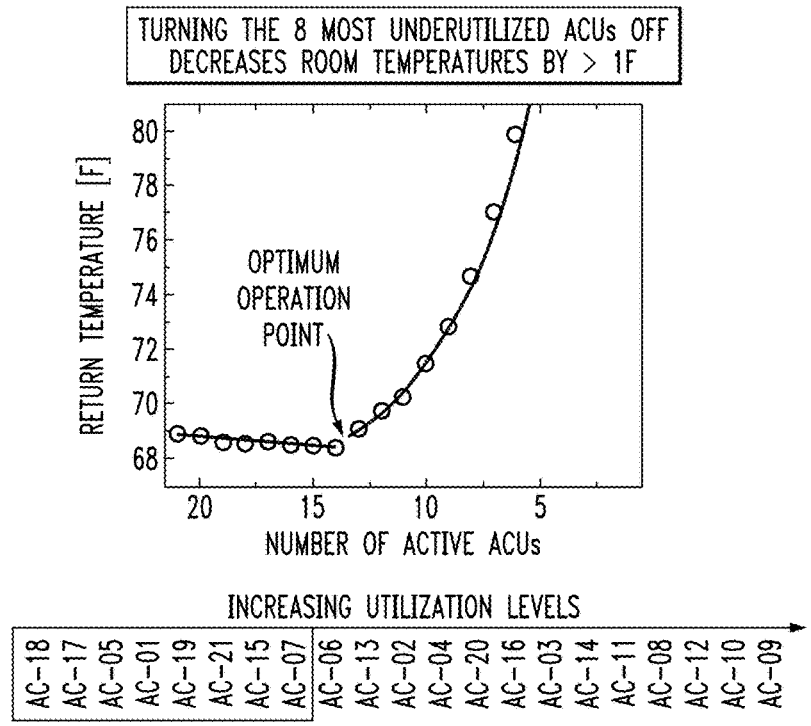
FIG. 7 is a diagram illustrating how turning off the redundant, i.e., most underutilized, ACUs in the data center can decrease the room temperature according to an embodiment of the present invention.

It is notable that by turning off or reducing the fan speed (where fan speed control is available) of redundant ACUs, the temperature in the data center will actually decrease. See FIGS. 6 and 7. This is due to the fact that the blower in the ACU produces heat. If an ACU is very poorly utilized, then this ACU can actually generate more heat than it removes. FIG. 6 is a diagram illustrating that (according to this example) turning off the (in this case eight) redundant, i.e., most underutilized, ACUs in the data center will actually decrease the supply temperature (measured as temperature in the sub-floor plenum) by greater than three degrees Fahrenheit (° F.). Further, FIG. 7 is a diagram illustrating how this act of turning off the (e.g., eight-most) underutilized/redundant ACUs in the sample data center decreases the room temperature (i.e., the temperature in the data center) by greater than 1° F. The effects shown in FIGS. 6 and 7 are notable since they illustrate how with common data center practices of greatly over-provisioning cooling can actually lead to greater supply/room temperatures. It is this effect that the present techniques address and serve to prevent by distinguishing between base ACUs and these redundant (over-provisioned) ACUs (see step 204 of FIG. 2, above). This identification and distinguishing between base and redundant ACUs can, according to the present techniques, be performed on a regular basis, so as to maintain a maximum level of cooling efficiency in the data center due to changes in the data center (e.g., changes in IT equipment and/or other equipment changes—such as add/delete equipment or moving equipment within the data center). According to an exemplary embodiment, the assessment and distinguishing between base ACUs and redundant ACUs (step 204) is performed once a month for a given data center.

As provided above, the present techniques will focus on controlling (turning on/off or adjusting fan speed) only those ACUs in the data center identified (in step 204) to be redundant ACUs for cooling purposes. The redundant ACUs will be placed in standby mode (e.g., turned off or placed at the lowest fan speed setting), and will be turned on (or the fan speed will be increased) (automatically) when needed, based on control events as described below. The cost savings in terms of cooling for a given data center by employing the present techniques can be extremely significant. For example, in the exemplary data center shown in FIG. 3, implementing the present techniques (given present energy costs) is expected to result in a savings of more than $60,000 per year, which is a very significant fraction of the overall costs to run a data center.

Figure 8:
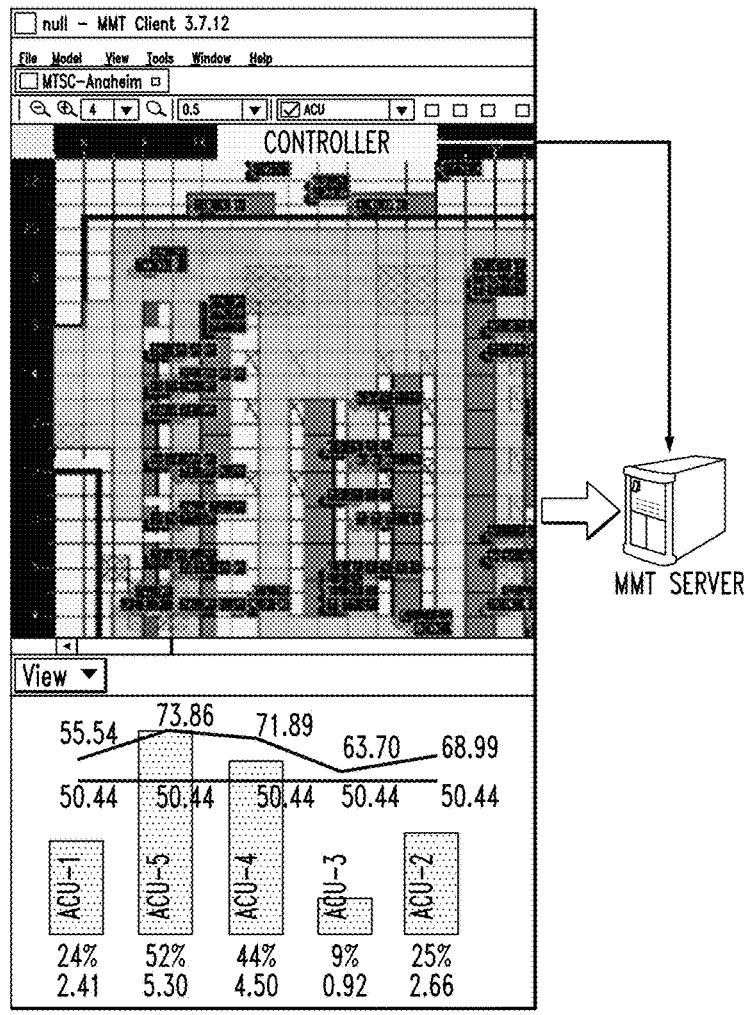
FIG. 8 is a diagram illustrating an exemplary data center wherein the redundant ACUs in the data center are under the (on/off) control of controllers all of which are tied into a MMT server according to an embodiment of the present invention.

An example is now provided to illustrate how the control aspects of the present techniques may be carried out. An exemplary data center is shown in FIG. 8. Using the above-described process, it is determined in this case that there are two redundant ACUs in this data center. The present techniques may be implemented using a controller or controllers which are themselves under the control of an MMT server. MMT was described above. In one exemplary embodiment, the MMT server is embodied in an apparatus, such as apparatus 2000 shown in FIG. 20, described below.

In this example, one controller is employed to control two ACUs, and the controller is under the control of an MMT server. Multiple controllers can be used and connected to the MMT server. As will be described in detail below, in one exemplary embodiment, the controllers are simple relay circuits responsible for turning the redundant ACUs on or off based on commands to do so sent from the MMT server. In another exemplary embodiment, the controllers are more capable devices able to control the fan speed or other configuration of the redundant ACUs.

Figure 9:
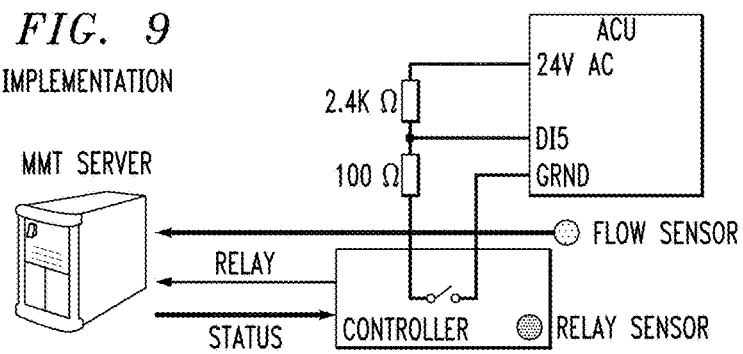
FIG. 9 is a schematic diagram illustrating an exemplary system for implementing the present techniques according to an embodiment of the present invention.

For example, FIG. 9 is a schematic diagram illustrating an exemplary system for implementing the present techniques. As shown in FIG. 9, the MMT server can turn redundant ACUs in the data center on or off by way of a controller (or controllers). According to the exemplary embodiment shown in FIG. 9, the controllers are simple relays that when open turn the ACUs (being controlled by the relay) on and when closed turn the ACUs (being controlled by the relay) off. Whether the relay is open or closed is controlled by the MMT server. See for example in FIG. 9, where the MMT server provides the status of the redundant ACUs (on/off) to the relay. In one exemplary implementation, the controllers are Ethernet Relay boards with connections to the MMT server and to the ACUs. In another exemplary implementation, the controllers are more capable devices that communicate to the ACUs, e.g., via a computer interface, communication computer bus, or digital system, and to the MMT, via a wired or wireless network.

FIG. 9 also illustrates a failsafe mechanism of the present techniques which, as will be described in detail below, is also one of the control events—which is termed below a sensor or S(_)-event. Basically, the failsafe is that should anything in the control scheme appear incorrect, the default is to turn the respective redundant ACUs on or set the fan speed to its maximum value. For instance, in the example illustrated in FIG. 9, there is a flow sensor located proximate to the output of the ACUs which measures airflow from the ACUs. There is also an ACU sensor located at the relay, which can turn on/off such ACU, or the more capable controller, which can adjust the ACU fan. The ACU sensor detects a state of the ACU (e.g., on/off or fan speed level in the case of fan speed control). The MMT server monitors the data from these sensors (as well as other sensors in the data center). The data from the sensors has to be consistent, otherwise the failsafe mechanism will be initiated. Namely, if the ACU sensor indicates that the corresponding ACU is on, e.g., that the relay is open, then the flow sensors at the ACUs should indicate 100% airflow at the ACUs. Conversely, if the ACU sensor indicates that the corresponding ACU is off, e.g., that the relay is closed, then the flow sensors at the ACUs should indicate zero airflow at the ACUs. If however, these sensor readings are at odds with one another, e.g., the ACU sensor indicates that the ACU is on, but there is zero air flow at the ACUs, then the failsafe mechanism causes the ACUs to turn on. This type of inconsistency in sensor data may be the result of a power disruption to the controller relay, and will result in the ACUs to turn on as a safety precaution. The data from the sensors also has to be consistent with the ACU status the MMT server provides for each of the redundant ACUs under its control. For instance, if the MMT server has the status of a given ACU as on, but the ACU sensor reports conflicting data (e.g., the ACU sensor data indicates that the ACU is off) and/or the flow sensor reports conflicting data (e.g., the flow sensor reports 0% air flow at the ACU), then the failsafe method according to the present techniques will turn on one or more of the redundant ACUs based on a severity of the failure. The converse situation will also trigger a failsafe response, i.e., wherein the ACU status is off, but the ACU sensor data and/or the flow sensor data indicate that the ACU is on. These types of inconsistencies are categorized herein as sensor or $S_{(13)}$-events since they are likely the result of faulty sensors. As mentioned previously, the same type of failsafe method will be applicable whether the ACUs are controlled in an on/off mode or whether the fan speed of the blower is controlled.

As provided above, the MMT server is fed data from the various sensors (e.g., temperature, pressure, relay, ACU, etc. sensors) throughout the data center. This data is provided from the sensors to the MMT server through a data hub. As will be described in detail below, communication failures between the data hub and the MMT server can result in a control event (also termed a network failure event or N-event) which can be a trigger event for switching on one or more of the redundant ACUs, or adjust their fan speed, as applicable. As also provided above, as a failsafe, the relay/controller will as a default turn on the respective ACUs, or adjust its fan speed, as applicable. Thus, for example, in the case of a communication error between the MMT server and the data hub may result in the failsafe mechanism turning all of the redundant ACUs on a particular data hub on (see below).

The control events are now described in detail. The MMT server will control/turn on redundant ACUs in the data center based on control events such as: 1) (excessive—based for example on predetermined safe operating temperature ranges for the given data center) temperatures in the data center—also referred to herein as T-events, 2) (excessive low—based for example on predetermined proper plenum pressure ranges for the given data center) pressure in the plenum of the data center—also referred to herein as P-events, 3) a failure of one or more of the base ACUs, e.g., no air flow going out of the ACU,—also referred to herein as F-events, 4) network issues such as network connection errors between the MMT server and the controller(s) and/or network connection errors between the MMT server and the sensors—also referred to herein as N-events, and 5) sensor issues such as out of range sensor readings, referred to herein as $S_{(13)}$-events, (these out of range values indicating T-events, P-events, F-events and/or R-events) and/or inconsistent sensor readings. As used herein, R stands for ACU sensor (as described above), for example, S events can be S(T), S(P), S(F), S(R), for sensor values out of range or S(RS), S(FS), etc. for inconsistencies between sensor values and physical status of ACU. Inconsistent sensor readings include, for example, inconsistent readings from flow sensors and actuation status, inconsistent ACU sensor data and actuation status, and/or inconsistent flow sensor data and ACU sensor data (this scenario was described above and is illustrated in FIG. 9). Actuation status is sent by the MMT server, and thus the sensors should be consistent. See the tables in FIGS. 16A-D, FIGS. 17A-D, and FIGS. 18A-D (described below).

All of the control events are weighted by severity and are reported with severity. By way of example only, severity is user-specified. Severity can be based on the requirements of the datacenter. The events, conditions and weights are preferably configurable through the MMT server. Namely, the MMT server (see FIG. 20, described below) can have a graphic user interface which allows a user, such as a data center operator, to i) track conditions in the data center—based for example on the data collected by the MMT server from the sensors, ii) track the occurrences of any of the above described control events, and iii) designate a severity/weight to each control event. For instance, a data center operator with knowledge of a particular data center might be able to judge the severity of different error conditions and assign a weighting to different control events based on this severity.

According to an exemplary embodiment, all control events detected by the MMT server will be logged and added up until the total number of redundant ACUs has been reached. One full event counts for one redundant ACU. According to an exemplary embodiment, this is a threefold step; i) there is an event, ii) the "importance" of the event is weighted, and iii) then a decision is made as to how many events one wants to allow before an ACU gets turned on or its fan speed adjusted. All of these factors can be user configurable. It is notable that the present techniques allow for other configurations. For example, it can be configured that two full event counts for one redundant ACU or that one full event counts for increasing the fan speed of an ACU by 10% (which would be for 1/10 of one ACU).

Control events can be (automatically) removed/erased, however, only if it is safe to do so. For instance, as long as there are no new control events that are detected for at least a certain predetermined period of time, then numbers of control events can be decreased which in turn reduces the cooling by either turning an ACU off and/or reducing the fan speed. In one exemplary embodiment control events are erased in increments of 1, meaning that if a given control event is erased from the log, then the predetermined time period must elapse without incident before another control event can be erased, and so on. A simple example may be used to illustrate this principle. Say for instance that a T-event 1 is detected (and logged) by the MMT server (based on data obtained from temperature sensors in the data center). As a result, the MMT server will turn on one or more of the redundant ACUs. If the predetermined period of time expires without the detection of another T-event, then the T-event 1 can be removed from the log, and the redundant ACUs can be turned back off—according to the procedures outlined below. If however another control event or events (such as an F-event) is detected within the predetermined time period, then the T-event 1 remains logged as does the new event(s). As provided above, the events are removed from the log one event at a time and, as will be described in detail below, the ACUs will be turned off on a unit by unit basis. These procedures act as a safeguard and operate on the principle that it is more likely that ACUs will be turned on rather than turned off by the (automatic) control process. An exemplary time period for removing/erasing events from the log might be a 1 hour time period.

Some exemplary (non-limiting) scenarios will now be provided. FIG. 10A is a diagram illustrating some exemplary T-events and respective actions. Basically, T-events occur when temperature at one or more locations in the data center are detected to be above a threshold value. FIG. 10A also illustrates the weighting principles described above. Namely, a T-event may be based on the number of inlet temperatures above the threshold temperature for the data center (labeled "ACU threshold"). For example, temperature sensors located at the inlets to the IT equipment racks in the data center send data to the MMT server. As described above, a predetermined safe operating temperature range for the given data center may be determined. Here a determination is made as to how many locations in the data center report temperatures above the threshold value, e.g., how many inlet temperature readings are above that range (above the highest—threshold-value in that range). In this example, if at most 1 inlet readings register temperatures above the threshold value then the weight of this T-event is 0 and no action is taken. It is notable that 0 is being used merely as an example. It could be weighted with 0.2 (or something else) in order to accomplish proper control. For example, if the fan speed is controllable, 0.2 could increase the fan speed by 20%.

If between 2 and 3 of the inlet temperatures register temperature values above the threshold value, then this T-event is given a weight of 1 and 1 redundant ACU is turned on—the ACU being turned on is the unit closest to the rack(s) registering the high temperatures. For multiple sensors reporting high temperatures the geometrical mean can be used to determine the closest ACU. Throughout the present description, the concept of geometrical mean can be employed to determine the (geographically) closest ACU to (multiple) sensors. In this example, once a certain number (or more) of inlet temperatures register values above the safe operating range (in this example more than 7), then all of the redundant ACUs are switched on.

Similarly, FIG. 10B is a diagram illustrating exemplary P-events and respective actions. Namely, here it is determined how many locations in the sub-floor plenum are reporting pressure values below a certain threshold. Based on the same present weighting principle for events described above, a P-event may be based on the measured pressure (e.g., measured in Pascals (Pa)) in the sub-floor plenum (which can be determined by the MMT server based on data obtained from pressure sensors located in the sub-floor plenum). In this case, a higher sub-floor plenum pressure the better, and predetermined safe sub-floor plenum pressure ranges may be set for the data center (labeled "ACU threshold"). Alternatively, an average plenum pressure could be used. Thus, in the case where only one sensor is below the threshold, then the weight of this P-event is 0 and no action is taken. However if, for example, two sensors are below the threshold, then the weight of this P-event is 1, and one of the closest redundant ACUs is turned on. In this particular non-limiting example, once more than five pressure sensors are at or below a certain value, all of the redundant ACUs are switched on.

As described above, (air) flow sensors located proximate to the ACUs detect the air flow produced by the ACUs. FIG. 10C is a diagram illustrating exemplary F-events and respective actions. Based on the same present weighting principle for events described above, an F-event may be based on the airflow from each of the ACUs. Namely, when an ACU fails (is inoperable or is performing poorly) the airflow from that ACU will be reduced or cease altogether. Here, the interest is in failure events affecting the base ACUs. So the airflow sensors on the base ACUs registering no airflow (which are "off" meaning that the ACUs are not producing the proper level of cooling) are taken into account. Ideally, all of the base ACU airflow sensors would be registering airflow from the base ACUs, which would be on. So in this example, an event weight is assigned based on the number of base ACUs which have failed based on the airflow detected from the base ACUs. As shown in FIG. 10C, the greater the number of failures in the base ACUs, the greater the number of redundant ACUs that are turned on. In this example, once the number of base ACU failures is above a certain number/level, then all of the redundant ACUs are switched on.

FIGS. 10D-F are diagrams graphically depicting these T, P, and F-events, respectively, showing for example, how temperature and/or pressure above/below a threshold value for the data center (as described above) can lead to a control event. The response to one or more T, P, and F-events is shown graphically in FIG. 10G, where the number of active redundant ACUs turned on (over time) are shown. As shown in FIG. 10G, according to this exemplary implementation of the present techniques, the events are cumulative, and the response to an event(s) occurring (i.e., turning on a redundant ACU(s)) is proportional. Specifically, as described above, all of the redundant ACUs will be turned on only after a certain threshold of control events has been met or exceeded.

As provided above, other control events include N-events, i.e., network connection failure events where the MMT server fails to communicate with a relay (for turning on/off redundant ACUs) and/or controller (for adjusting ACUs fan speed) and/or network connection failure events where the MMT server fails to communicate with a data hub (for collecting data from the temperature, pressure, relay, etc. sensors). Each of these types of network communication failures could result in high operating temperatures in the data center if left unaccounted for, thus the N-event control is implemented.

The first type of network communication failure event that is examined here is a network communication failure between the MMT server and a given one or more of the relays (for turning on/off redundant ACUs), and/or between the MMT server and the control device (for adjusting fan speed of the redundant ACUs). As described, for example, in conjunction with the description of FIG. 9, above, the MMT server detects whether it was able to communicate with the relays or control device (generally any communication is being acknowledged—so that the MMT server will know whether it was able to connect to the controller or relay). According to the example shown in FIG. 11A, if the MMT server fails to communicate with a given one or more of the relays and/or the control device once, the weight of this N-event is zero and no action is taken. However, if/when a second consecutive network communication failure occurs between the MMT server and the given relay(s) and/or control device, then a watchdog circuit turns on all of the ACUs on that particular relay or control device are turned on. According to this exemplary embodiment, the relay/controller is a failsafe that, in the case of an error, turns the redundant ACUs on. By way of example only, this failsafe mechanism can be implemented by programming this response into the watchdog circuit. For instance, the watchdog circuit is reset each time the MMT server is able to communicate with the relay or control device. If the watchdog circuit is not reset after a given time the ACU will turn on (failsafe).

The second type of network communications failure event that is examined here is a network communication failure between the MMT server and a data hub. As described above, the MMT server receives data regarding the conditions in the data center from a data hub(s). If the MMT server is unable to communicate with the data hub(s), then a high temperature (or F-event, or P-event) condition may exist that the MMT server cannot detect. Thus, as a failsafe mechanism, these network connection failures are considered a control event (an N-event). In the example shown in FIG. 11A, if the MMT server fails to communicate with a given one (or more) of the data hubs once, then the weight of this type of N-event is zero, and no action is taken. However, if/when a second consecutive network communication failure occurs between the MMT server and the given data hub(s), then the, for example, 2 closest (to the location of the data hub) redundant ACUs are turned on. Similarly, all the redundant ACUs could be turned on.

FIGS. 11B-D depict graphically these two types of N-events (network connection failure between the MMT server and the relays or controller and/or between the MMT server and the data hub) and the respective number of redundant ACUs that are turned on as a result, respectively. The solid dots in FIGS. 11B and 11C schematically represent the event counter (an illustrative example).

The present techniques also take into account the situation where a sensor goes bad and gives a faulty reading. A faulty reading is determined based on the sensor reporting out of range values. Basically, as described above, there is a predetermined temperature range, pressure range, air flow range, etc. for a given data center. Any value being reported by a sensor (or sensors) that is outside of these predetermined ranges may be considered to be out of range, an indicative of a faulty sensor. The reporting of such out of range values by a sensor is considered herein to be a control event, i.e., an S(_)-event. The situation where inlet temperature sensors (i.e., temperature sensors located at the inlets of the IT equipment racks in the data center—see above), an S(T)-event, are reporting out of range temperature values is illustrated in FIGS. 12A-C. As shown in FIG. 12A, in this exemplary case, if one of the (inlet) temperature sensors is reporting out of range values, then this S(T)-event is given a weight of zero and no action is taken. However, as described above, the control events are cumulative. So if/when a second consecutive sensor reports out of range inlet temperature values, then the closest redundant ACU(s) (to the location of the sensor(s)) are turned on. In this example, when there are two consecutive reports of inlet temperature data and the number of inlet temperature sensors (reporting out of range values) is more than 4, then 1 redundant ACU is turned on (or its fan speed is increased). If in the second consecutive reporting of out range inlet temperature values more than 8 inlet temperature sensors are reporting out of range values then 2 redundant ACUs are turned on and so on (or their fan speeds are increased). When more than 18 inlet temperature sensors are reporting out of range values, then the highest weight is assigned and all of the redundant ACUs are turned on (or their fan speed is increased to their maximum value).

FIGS. 12B and C are diagrams graphically depicting exemplary S(T)-events where one or more sensor values are out of range and the resulting number of activated—turned on—(redundant) ACUs based on the exemplary S(T)-events. The exemplary case where 4 (or more) inlet temperature sensors are reporting out of range values is shown highlighted in FIG. 12B which, as shown in FIG. 12C, results in an increase in the number of redundant ACUs being turned on.

The next type of SL)-event described is that involving a pressure sensor reading that is out of range. Namely, any pressure sensor reporting a pressure value outside of the predetermined range is considered herein to be faulty. A pressure sensor reporting an out of range value is considered herein to be a control event, an S(P)-event. The situation where plenum pressure sensors (i.e., pressure sensors located within the sub-floor plenum in the data center) are reporting out of range pressure values is illustrated in FIGS. 13A-C. As shown in FIG. 13A, in this exemplary case, if one of the sub-floor plenum pressure sensors is reporting an out of range value, then this S(P)-event is given a weight of zero and no action is taken. However, as described above, the control events are cumulative. So if/when a second consecutive sensor reports out of range sub-floor plenum pressure values, then the closest redundant ACU(s) (to the location of the sensor(s)) are turned on. In this example, when there are two consecutive reports of sub-floor plenum pressure data and the number of sub-floor plenum pressure sensors (reporting out of range values) is more than 2, then 1 redundant ACU is turned on (or its fan speed is increased). If in the second consecutive reporting of out range sub-floor pressure values more than 4 sub-floor pressure sensors are reporting out of range values then 2 redundant ACUs are turned on and so on (or their fan speeds are increased). When more than 8 sub-floor plenum pressure values reported are out of range, then the highest weight is assigned and all of the redundant ACUs are turned on (or their fan speed is increased to their maximum value).

FIGS. 13B and C are diagrams graphically depicting exemplary S(P)-events where one or more sensor values are out of range and the resulting number of activated—turned on—(redundant) ACUs based on the exemplary S(P)-events. The exemplary case where 2 (or more) sub-floor plenum pressure sensors are reporting out of range values is shown highlighted in FIG. 13B which, as shown in FIG. 13C, results in an increase in the number of redundant ACUs being turned on.

The next type of $S_{(13)}$-event described is that involving an air flow sensor reading that is out of range. Namely, any air flow sensor reporting an out of range value is considered herein to be a control event, an S(F)-event. The situation where air flow sensors (i.e., air flow sensors located proximate to the ACU air discharge) are reporting out of range values is illustrated in FIGS. 14A-C. As shown in FIG. 14A, in this exemplary case, if one of the air flow sensors is reporting an out of range value, then this S(F)-event is given a weight of zero and no action is taken. However, as described above, the control events are cumulative. So if/when a second consecutive sensor reports out of range air flow values, then the closest redundant ACU(s) (to the location of the sensor(s)) are turned on. In this example, when there are two consecutive reports of air flow data and the number of air flow sensors (reporting out of range values) is more than 1, then 1 redundant ACU is turned on (or its fan speed is increased). If in the second consecutive reporting of out range air flow values more than 2 air flow sensors are reporting low (out of range values) then 2 redundant ACUs are turned on and so on (or their fan speeds are increased). When more than 4 air flow values reported are out of range, then the highest weight is assigned and all of the redundant ACUs are turned on (or their fan speed is increased to their maximum value).

FIGS. 14B and C are diagrams graphically depicting exemplary S(F)-events where one or more sensor values are out of range and the resulting number of activated—turned on—(redundant) ACUs based on the exemplary S(F)-events.

As described above, the controller/relays are also preferably outfitted with sensors which report (to the MMT server) whether for example a given one of the relays is open (the respective redundant ACU controlled by the relay is on) or closed (the respective redundant ACU controlled by the relay is off). Instead of the status of the relay, a sensor could report the fan setting if the ACU has variable fan control. Any ACU sensor reporting an out of range value is considered herein to be a control event, an S(R)-event. The situation where ACU sensors are reporting out of range values is illustrated in FIGS. 15A-C. As shown in FIG. 15A, in this exemplary case, if one of the ACU sensors is reporting an out of range value, then this S(R)-event is given a weight of zero and no action is taken. However, as described above, the control events are cumulative. So if/when a second consecutive ACU sensor reports out of range values, then the closest redundant ACU(s) (to the location of the sensor(s)) are turned on. In this example, when there are two consecutive reports of ACU sensor data and the number of sensors reporting out of range values is 1, then 1 redundant ACU is turned on (or its fan speed increased). If in the second consecutive reporting of out range ACU sensor values 2 ACU sensors are reporting out of range values then 2 redundant ACUs are turned on and so on (or their fan speeds are increased). When 4 ACU sensors report out of range data, then the highest weight is assigned and all of the redundant ACUs are turned on (or their fan speed is increased to their maximum value).

FIGS. 15B and C are diagrams graphically depicting exemplary S(R)-events where one or more sensor values are out of range and the resulting number of activated—turned on—(redundant) ACUs based on the exemplary S(R)-events.

As described, for example, in conjunction with the description of FIG. 9, above, the status of the ACUs (on or off or fan speed) at the MMT server should be consistent with the ACU sensor data and the flow sensor data. Namely, if the ACU status is on, then the ACU sensor data should indicate that the relay is open and the flow sensor should report 100% air flow from the respective ACUs. Conversely, if the ACU status is off, then the ACU sensor data should indicate that the relay is closed and the flow sensor should report 0% air flow from the respective ACUs. Any inconsistencies in the status and the data from the relay and/or air flow sensors are considered herein to be a $S_{(13}S)$-event since such inconsistencies can be indicative of a failure of the ACU sensors and/or the air flow sensors. The scenario involving inconsistencies between the status and the ACU sensor data, an S(RS)-event, is examined in FIGS. 16A-D. As shown in FIG. 16A, in this example, if there is a single inconsistency between the ACU sensor data and the ACU status, then this S(RS)-event is given a weight of 1 and one of the closest redundant ACUs (to the location of the sensor(s)) is turned on (or its fan speed increased). Two inconsistencies between the sensor data and the ACU status results in 2 redundant ACUs being turned, and so on (or their fan speeds increased). Once 4 (or more) inconsistencies are detected, then all of the redundant ACUs are turned on (or their fan speed is increased to their maximum value).

FIG. 16B is a diagram graphical depicting ACU sensor data acquired over time, and FIG. 16C is a diagram graphical depicting ACU status over time. FIG. 16D shows the number of activated—turned on—(redundant) ACUs based on inconsistencies between the ACU status and the ACU sensor data.

The scenario involving inconsistencies between the status and the flow sensor data is examined in FIGS. 17A-D. As shown in FIG. 17A, in this example, if there is a single inconsistency between the flow sensor data and the ACU status, then this S(FS)-event is given a weight of 1 and one of the closest redundant ACUs (to the location of the sensor(s)) is turned on (or its fan speed is increased). Two inconsistencies between the sensor data and the ACUS status results in 2 redundant ACUs being turned, and so on (or their fan speeds are increased). Once 4 (or more) inconsistencies are detected, then all of the redundant ACUs are turned on (or their fan speed is increased to their maximum value).

FIG. 17B is a diagram graphical depicting flow sensor data acquired over time, and FIG. 17C is a diagram graphical depicting ACU status over time. FIG. 17D shows the number of activated—turned on—(redundant) ACUs based on inconsistencies between the ACU status and the flow sensor data.

The scenario involving inconsistencies between the ACU sensor data and the flow sensor data, an S(RF)-event, is examined in FIGS. 18A-D. As shown in FIG. 18A, in this example, if there is a single inconsistency between the ACU sensor data and the flow sensor data, then this S(RF)-event is given a weight of 1 and one of the closest redundant ACUs (to the location of the sensor(s)) is turned on (or its fan speed is increased). Two inconsistencies between the ACU sensor data and the flow sensor data results in 2 redundant ACUs being turned, and so on (or their fan speeds are increased). Once 4 (or more) inconsistencies are detected, then all of the redundant ACUs are turned on (or their fan speed is increased to their maximum value).

FIG. 18B is a diagram graphical depicting flow sensor data acquired over time, and FIG. 18C is a diagram graphical depicting ACU sensor data acquired over time. FIG. 18D shows the number of activated—turned on—(redundant) ACUs based on inconsistencies between the ACU sensor data and the flow sensor data.

Figure 19:
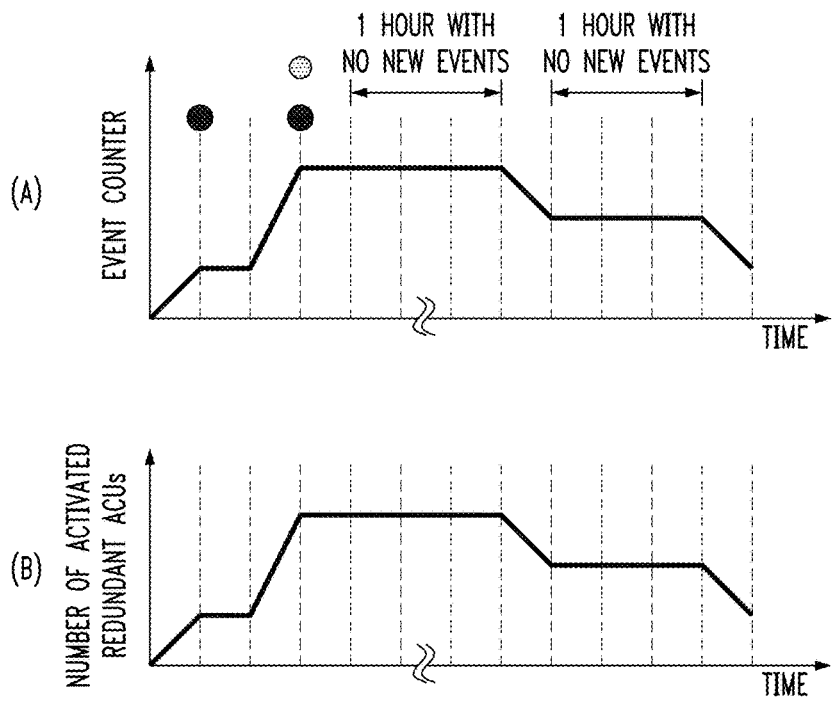
FIG. 19A is a diagram graphically depicting control events over time, and periods during which no new control events have occurred which signify that a redundant ACU may be switched off according to an embodiment of the present invention.
FIG. 19B is a diagram graphically depicting the number of redundant ACUs that are turned on in the data center over time, and how (when no new control events have occurred for a predetermined period of time) redundant ACUs may be switched off on a unit-by-unit basis according to an embodiment of the present invention.

Now that the ways in which redundant ACUs are turned on or their fan speed increased has been outlined, the process for turning off (switched on) or reducing fan speed of ACUs is now described. According to the present techniques, a different mechanism is used to turn redundant ACUs back off or reduce their fan speed. Namely, the following rules are applied to turn a redundant ACU back off or decrease its fan speed. Rule 1) redundant ACUs will only be turned off or decrease its fan speed on a unit-by-unit basis. Thus, even though more than one redundant ACU might be turned on in response to a control event (see above), the ACUs are switched off or their fan speed decreased only one at a time. Rule 2) redundant ACUs will be turned off or their fan speed decreased only if a new control event does not occur for at least a predetermined period of time, e.g., an ACU will only be turned off or its fan speed decreased if no new control events have occurred for, as an example, one hour (or more). Rule 3) ACUs will only be turned off or their fan speed decreased during specified times. By way of example only, ACUs will only be turned off or their fan speed decreased during the work day, such as on weekdays between 7 am to 5 pm. That way any possible adverse results from turning off or decreasing the fan speed of the ACUs can be more readily detected since they will occur during the workday when staff are present. These rules are set up as failsafes and are devised such that it is more likely that ACUs are turned on or their fan speed increased as opposed to being turned off or having decreased fan speed. FIG. 19A is a diagram graphically depicting control events over time (where the control events are depicted by grey and black circles). FIG. 19B is a diagram graphically depicting the number of redundant ACUs that are turned on in the data center over time. Comparing FIG. 19A with FIG. 19B it can be seen that (in this example) when a period of at least one hour elapses without any new control events occurring (and assuming the other Rules are met), then one redundant ACU may be turned off, decreasing the number of active redundant ACUs in the data center by one.

Figure 20:
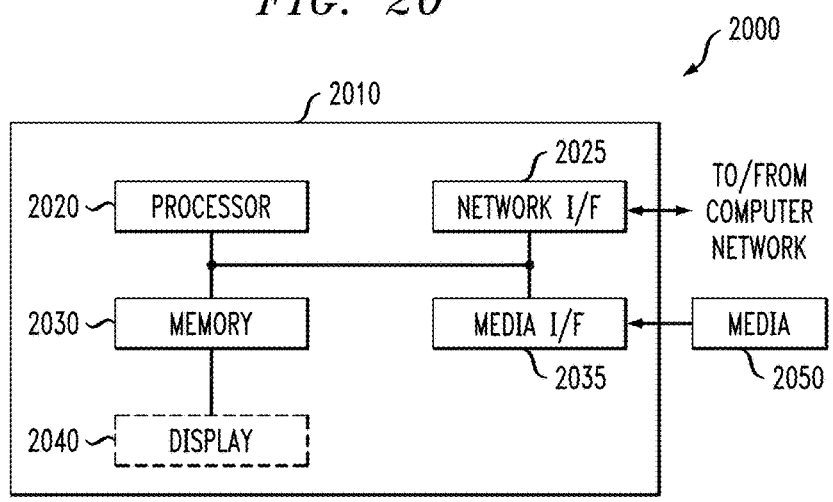
FIG. 20 is a diagram illustrating an exemplary apparatus for (automatically) controlling ACUs in an indoor environment, such as a data center according to an embodiment of the present invention.

Turning now to FIG. 20, a block diagram is shown of an apparatus 2000 for (automatically) controlling ACUs in an indoor environment, such as data center 100, in accordance with one embodiment of the present invention. It should be understood that apparatus 2000 represents one embodiment for implementing methodology 200 of FIG. 2, described above.

Apparatus 2000 includes a computer system 2010 and removable media 2050. Computer system 2010 includes a processor device 2020, a network interface 2025, a memory 2030, a media interface 2035 and an optional display 2040. Network interface 2025 allows computer system 2010 to connect to a network, while media interface 2035 allows computer system 2010 to interact with media, such as a hard drive or removable media 2050.

As is known in the art, the methods and apparatus discussed herein may be distributed as an article of manufacture that itself includes a machine-readable medium containing one or more programs which when executed implement embodiments of the present invention. For instance, the machine-readable medium may contain a program configured to identify which of the air conditioning units in the data center comprise base air conditioning units and which of the air conditioning units in the data center comprise redundant air conditioning units; increase output from one or more of the redundant air conditioning units in response to one or more control events; and decrease output from the redundant air conditioning units once a predetermined period of time has elapsed without a new control event occurring.

The machine-readable medium may be a recordable medium (e.g., floppy disks, hard drive, optical disks such as removable media 2050, or memory cards) or may be a transmission medium (e.g., a network including fiber-optics, the world-wide web, cables, or a wireless channel using time-division multiple access, code-division multiple access, or other radio-frequency channel). Any medium known or developed that can store information suitable for use with a computer system may be used.

Processor device 2020 can be configured to implement the methods, steps, and functions disclosed herein. The memory 2030 could be distributed or local and the processor device 2020 could be distributed or singular. The memory 2030 could be implemented as an electrical, magnetic or optical memory, or any combination of these or other types of storage devices. Moreover, the term "memory" should be construed broadly enough to encompass any information able to be read from, or written to, an address in the addressable space accessed by processor device 2020. With this definition, information on a network, accessible through network interface 2025, is still within memory 2030 because the processor device 2020 can retrieve the information from the network. It should be noted that each distributed processor that makes up processor device 2020 generally contains its own addressable memory space. It should also be noted that some or all of computer system 2010 can be incorporated into an application-specific or general-use integrated circuit.

Optional video display 2040 is any type of video display suitable for interacting with a human user of apparatus 2000. Generally, video display 2040 is a computer monitor or other similar video display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for controlling air conditioning units in a data center, the method comprising the steps of:
   determining utilization levels $v^i$ of each of the air conditioning units in the data center individually as: $v^i = P_{cool}^i / P_{cap}^i$, wherein $P_{cool}^i$ is removed heat and $P_{cap}^i$ is air conditioning unit cooling capacity of each of the air conditioning units, wherein $P_{cool}^i$ changes with total heat load in the data center, and wherein total heat load in the data center includes heat generated by the air conditioning units themselves;
   identifying which of the air conditioning units in the data center comprise base air conditioning units and which of the air conditioning units in the data center comprise redundant air conditioning units using the utilization levels and a given redundancy requirement, wherein the identifying further comprises: i) setting an optimum operating point for at least one parameter in the data center, ii) observing the utilization levels $v^i$ of each of the air conditioning units in the data center over a given observation period, and iii) turning off the air conditioning units in the data center with a lowest utilization level $v^i$ recursively until the at least one parameter in the data center reaches an inflection point below the optimum operating point;

increasing output from one or more of the redundant air conditioning units in response to one or more control events; and decreasing output from the redundant air conditioning units once a predetermined period of time has elapsed without a new control event occurring.

2. The method of claim 1, wherein output from the one or more redundant air conditioning units is increased by turning on the one or more redundant air conditioning units, and output from the one or more redundant air conditioning units is decreased by turning off the one or more redundant air conditioning units.

3. The method of claim 1, wherein the air conditioning units in the data center have fan speed control, and wherein output from the one or more redundant air conditioning units is increased by increasing a fan speed of the one or more redundant air conditioning units, and output from the one or more redundant air conditioning units is decreased by decreasing the fan speed of the one or more redundant air conditioning units.

4. The method of claim 1, wherein the control events are weighted by severity.

5. The method of claim 1, wherein the control events are cumulative.

6. The method of claim 1, wherein one or more of the control events comprise T-events wherein temperatures at one or more locations in the data center exceed a threshold value.

7. The method of claim 6, wherein the T-events are weighted by severity based on a number of the locations having a temperature that exceeds the threshold value.

8. The method of claim 1, wherein the data center comprises a sub-floor plenum through which chilled air is introduced by the air conditioning units to the data center, and wherein one or more of the control events comprise P-events wherein pressure values at one or more locations in the sub-floor plenum are below a threshold value.

9. The method of claim 8, wherein the P-events are weighted by severity based on a number of the locations having a pressure value that is below the threshold value.

10. The method of claim 1, wherein one or more of the control events comprise F-events wherein failures occur at one or more of the base air conditioning units.

11. The method of claim 10, wherein the F-events are weighted by severity based on a number of the base air conditioning units at which the failures occur.

12. The method of claim 1, wherein the redundant air conditioning units are controlled by relays connected to an MMT server through a network, and wherein one or more of the control events comprise N-events wherein network communication failures occur between the MMT server and the relays, the method further comprising the step of:

turning on all of the redundant air conditioning units controlled by a given one of the relays for which a network communication failure between the MMT server and the given relay has occurred.

13. The method of claim 12, wherein the N-events are weighted by severity based on a number of the network communication failures that occur between the MMT server and the relays.

14. The method of claim 1, wherein temperatures at one or more locations in the data center are detected using temperature sensors, and wherein one or more of the control events comprise S-events wherein the temperature sensors report out of range values.

15. The method of claim 14, wherein the S-events are weighted by severity based on a number of the temperature sensors reporting the out of range values.

16. The method of claim 1, wherein the data center comprises a sub-floor plenum through which chilled air is introduced by the air conditioning units to the data center, and wherein pressure values at one or more locations in the sub-floor plenum are detected using pressure sensors, and wherein one or more of the control events comprise S-events wherein the pressure sensors report out of range values.

17. The method of claim 16, wherein the S-events are weighted by severity based on a number of the pressure sensors reporting the out of range values.

18. The method of claim 1, wherein air flow at the base air conditioning units and at the redundant air conditioning units is detected using air flow sensors, and wherein one or more of the control events comprise S-events wherein the air flow sensors report out of range values.

19. The method of claim 18, wherein the S-events are weighted by severity based on a number of the air flow sensors reporting the out of range values.

20. The method of claim 1, wherein the redundant air conditioning units are controlled by relays or by a computer interface, a communication computer bus, or a digital system, connected to an MMT server through a network, that are equipped with air conditioning unit sensors detecting a state of the air conditioning unit, and wherein one or more of the control events comprise $S_{(13)}$-events wherein the air conditioning unit sensors report out of range values.

21. The method of claim 20, wherein the $S_{(13)}$-events are weighted by severity based on a number of the air conditioning unit sensors reporting the out of range values.

22. The method of claim 20, wherein one or more of the control events comprise $S_{(13}S)$-events wherein inconsistencies occur between data obtained from the air conditioning unit sensors and a status of the redundant air conditioning units, wherein the status comprises: i) whether the redundant air conditioning units are on or off, or ii) a fan speed of the redundant air conditioning units.

23. The method of claim 22, wherein the $S_{(13}S)$-events are weighted by severity based on a number of the inconsistencies that occur between the data obtained from the air conditioning unit sensors and the status of the redundant air conditioning units.

24. A non-transitory article of manufacture for controlling air conditioning units in a data center, comprising a machine-readable medium containing one or more programs which when executed implement the steps of:

determining utilization levels $v^i$ of each of the air conditioning units in the data center individually as: $v^i = P_{cool}^i / P_{cap}^i$, wherein $P_{cool}^i$ is removed heat and $P_{cap}^i$ is air conditioning unit cooling capacity of each of the air conditioning units, wherein $P_{cool}^i$ changes with total heat load in the data center, and wherein total heat load in the data center includes heat generated by the air conditioning units themselves;

identifying which of the air conditioning units in the data center comprise base air conditioning units and which of the air conditioning units in the data center comprise redundant air conditioning units using the utilization levels and a given redundancy requirement, wherein the identifying further comprises: i) setting an optimum operating point for at least one parameter in the data center, ii) observing the utilization levels $v^i$ of each of the air conditioning units in the data center over a given observation period, and iii) turning off the air conditioning units in the data center with a lowest utilization level $v^i$ recursively until the at least one parameter in the data center reaches an inflection point below the optimum operating point;

increasing output from one or more of the redundant air conditioning units in response to one or more control events; and decreasing output from the redundant air conditioning units once a predetermined period of time has elapsed without a new control event occurring.

25. An apparatus for controlling air conditioning units in a data center, the apparatus comprising:

a memory; and at least one processor, coupled to the memory, operative to:

determine utilization levels $v^i$ of each of the air conditioning units in the data center individually as: $v^i = P_{cool}^i / P_{cap}^i$, wherein $P_{cool}^i$ is removed heat and $P_{cap}^i$ is air conditioning unit cooling capacity of each of the air conditioning units, wherein $P_{cool}^i$ changes with total heat load in the data center, and wherein total heat load in the data center includes heat generated by the air conditioning units themselves;

identify which of the air conditioning units in the data center comprise base air conditioning units and which of the air conditioning units in the data center comprise redundant air conditioning units using the utilization levels and a given redundancy requirement, wherein the identify further comprises: i) setting an optimum operating point for at least one parameter in the data center, ii) observing the utilization levels $v^i$ of each of the air conditioning units in the data center over a given observation period, and iii) turning off the air conditioning units in the data center with a lowest utilization level $v^i$ recursively until the at least one parameter in the data center reaches an inflection point below the optimum operating point;

increase output from one or more of the redundant air conditioning units in response to one or more control events; and decrease output from the redundant air conditioning units once a predetermined period of time has elapsed without a new control event occurring.

26. The method of claim 1, wherein at least one parameter in the data center is selected from the group consisting of: return temperature and plenum pressure.

* * * * *